United States Patent
Xiao

(10) Patent No.: US 8,217,471 B2
(45) Date of Patent: Jul. 10, 2012

(54) SYSTEM AND METHOD FOR METAL-OXIDE-SEMICONDUCTOR FIELD EFFECT TRANSISTOR

(75) Inventor: Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 172 days.

(21) Appl. No.: 12/650,494

(22) Filed: Dec. 30, 2009

(65) Prior Publication Data

US 2010/0171186 A1    Jul. 8, 2010

(30) Foreign Application Priority Data

Dec. 31, 2008  (CN) .......................... 2008 1 0205383

(51) Int. Cl.
*H01L 29/772* (2006.01)
(52) U.S. Cl. ........ 257/408; 257/336; 257/344; 257/346; 257/401; 257/E29.266; 257/E21.437
(58) Field of Classification Search ............... 257/408, 257/336, 344, 346, 401, E29.266, 437

See application file for complete search history.

(56) References Cited

U.S. PATENT DOCUMENTS

2006/0065928 A1 * 3/2006 Nagai .......................... 257/344

FOREIGN PATENT DOCUMENTS

CN           1921073 A    2/2007

* cited by examiner

*Primary Examiner* — Minchul Yang
(74) *Attorney, Agent, or Firm* — Kilpatrick Townsend and Stockton LLP

(57) ABSTRACT

System and method for metal-oxide-semiconductor field effect transistor. In a specific embodiment, the invention provides a field effect transistor (FET), which includes a substrate material, the substrate material being characterized by a first conductivity type, the substrate material including a first portion, a second portion, and a third portion, the third portion being positioned between the first portion and the second portion. The FET also includes a source portion positioned within the first portion, the source portion being characterized by a second conductivity type, the second conductivity type being opposite of the first conductivity type. A first drain portion is positioned within second portion and characterized by the second conductivity type and a first doping concentration. A second drain portion is positioned within the second portion and is characterized by the second conductivity type and a second doping concentration, the second doping concentration being different from the first doping concentration.

20 Claims, 24 Drawing Sheets

SYSTEM AND METHOD FOR METAL-OXIDE-SEMICONDUCTOR FIELD EFFECT TRANSISTOR

CROSS-REFERENCES TO RELATED APPLICATIONS

This application claims priority to Chinese patent application no. 200810205383.0 filed Dec. 31, 2008, commonly assigned and hereby incorporated by reference for all purposes.

BACKGROUND OF THE INVENTION

The present invention is directed to integrated circuits and their processing for the manufacture of semiconductor devices. More particularly, the invention provides a system and m been applied to design and fabrication of metal-oxide-semiconductor field effect transistor with method for an improved field effect transistors. Merely by way of example, the invention has small dimensions. But it would be recognized that the invention has a much broader range of applicability. For example, the invention can be applied to other types of semiconductors.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such limit is the manufacturing of metal oxide semiconductor field-effect transistor (MOSFET) at reduced sizes.

Since the invention of the MOSFET, there has been continuous efforts to scale down for smaller dimensions. During the 1990's, the MOSFET channel lengths are typically in order of several micrometers. However, with the advent of improved fabrication process, the dimensions for MOSFET has been greatly reduced. More recently, the MOSFET channel lengths are being reduced to 90 nanometers or less.

There are various reasons for reducing MOSFET sizes. For example, by reducing the size of MOSFET devices, the material and area needed for a MOSFET on an integrated circuit is reduced, and so is the cost. In addition, MOSFET with a smaller size usually means allow more current to pass through. There are other benefits as well.

However, the redaction of transistors sizes sometimes also introduces various problems for MOSFET performance, efficiency, and reliability. In the past various techniques have been developed. Unfortunately, these techniques are often inadequate.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a system and method for an improved field effect transistors. Merely by way of example, the invention has been applied to design and fabrication of metal-oxide-semiconductor field effect transistor with small dimensions. But it would be recognized that the invention has a much broader range of applicability. For example, the invention can be applied to other types of semiconductors.

An embodiment of the present invention provides a field effect transistor (FET), which includes a substrate material characterized by a first conductivity type and having a first portion, a second portion, and a third portion, the third portion being positioned between the first portion and the second portion. A source portion is positioned within the first portion and characterized by a second conductivity type, which is opposite of the first conductivity type. A first drain portion is positioned within second portion and characterized by the second conductivity type and a first doping concentration. A second drain portion is positioned within the second portion and is characterized by the second conductivity type and a second doping concentration, the second doping concentration being different from the first doping concentration. A first dielectric material overlaying all of the third portion and partially overlaying the source portion, the first dielectric material also partially overlaying the first and the second drain portions. The FET also includes a conducting material overlaying the first dielectric material, the conducting material being configured to provide a gate contact.

In a specific embodiment, the invention provides a field effect transistor (FET). The FET includes a substrate material, the substrate material being characterized by a first conductivity type, the substrate material including a first portion, a second portion, and a third portion, the third portion being positioned between the first portion and the second portion. The FET also includes a source portion positioned within the first portion, the source portion being characterized by a second conductivity type, the second conductivity type being opposite of the first conductivity type. The FET additionally includes a first drain portion position within second portion, the first drain portion being characterized by the second conductivity type and a first doping concentration. Furthermore, the FET includes a second drain portion position within the second portion, the second drain portion being different from the first drain portion, the second portion being characterized by the second conductivity type and a second doping concentration. The FET additionally includes a first dielectric material, the dielectric material overlaying all of the third portion, the dielectric material partially overlaying the source portion, the dielectric material partially overlaying the source portion, the dielectric material partially overlaying the first and the second drain portions. The FET also includes a conducting material overlaying the first dielectric material, the conducting material being configured to provide a gate contact. In some embodiments, the FET being characterized by a channel length of about 135 nanometers or less and a reduced short channel effect.

According to another embodiment, the present invention provides a field effect transistor (FET). In some embodiments, the FET being characterized by a channel length of about 135 nanometers and a reduced short channel effect. The FET includes a substrate material, the substrate material being characterized by a first conductivity type, the substrate material including a first portion, a second portion, and a third portion, the third portion being positioned between the first portion and the second portion. The FET also includes a drain portion positioned within the first portion, the source portion being characterized by a second conductivity type, the second conductivity type being opposite of the first conductivity type. The FET additionally includes a first source portion position within second portion, the first source portion being characterized by the second conductivity type and a first doping concentration. The FET further includes a second source portion position within the second portion, the second source portion being different from the first drain portion, the second portion being characterized by the second conductivity type and a second doping concentration. Also, the FET includes a first dielectric material, the dielectric material overlaying all of the third portion, the dielectric material partially overlaying the source portion, the dielectric material partially overlaying the first and the second source portions, the dielectric material partially overlaying the drain portion. Moreover, the FET includes a conducting material overlaying the first dielectric material, the conducting material being configured to provide a gate contact.

According to yet another embodiment, the present invention provides a method for manufacturing a field effect transistor (FET). The method includes providing a semiconductor substrate. The method also includes defining a first trench structure on the substrate, the first trench structure having a first side and a second side. The method further includes forming an oxide layer overlaying the first trench structure. The method includes implanting the first side with a first type of polarity. The method also includes implanting the second side with a second type of polarity, the first type of polarity being opposite from the second type of polarity. The method additionally includes forming a first gate on the first side. The method includes forming a second gate on the second side. Furthermore, the method includes doping the first side at first concentration level. The method also includes doping the second side at a second concentration level. The method further includes forming a salicide layer on top of the first side and the second side. The method includes forming a first contact on the first side outside the first gate. The method also includes forming a second contact on the second gate. The method also includes providing a first metal layer overlaying the semiconductor substrate. In some embodiments, the FET being characterized by a channel length of about 135 nanometers or less and a reduced short channel effect.

Many benefits are achieved by way of the present invention over conventional techniques. For example, the present technique provides an easy to use process that relies upon conventional technology. In some embodiments, the field effect transistor can have adjustable current-voltage characteristics. In some embodiments, the transistors exhibit a reduced short channel effects. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a system and method for an improved field effect transistors. Merely by way of example, the invention has been applied to design and fabrication of metal-oxide-semiconductor field effect transistor with small dimensions. But it would be recognized that the invention has a much broader range of applicability. For example, the invention can be applied to other types of semiconductors.

Figure 1:
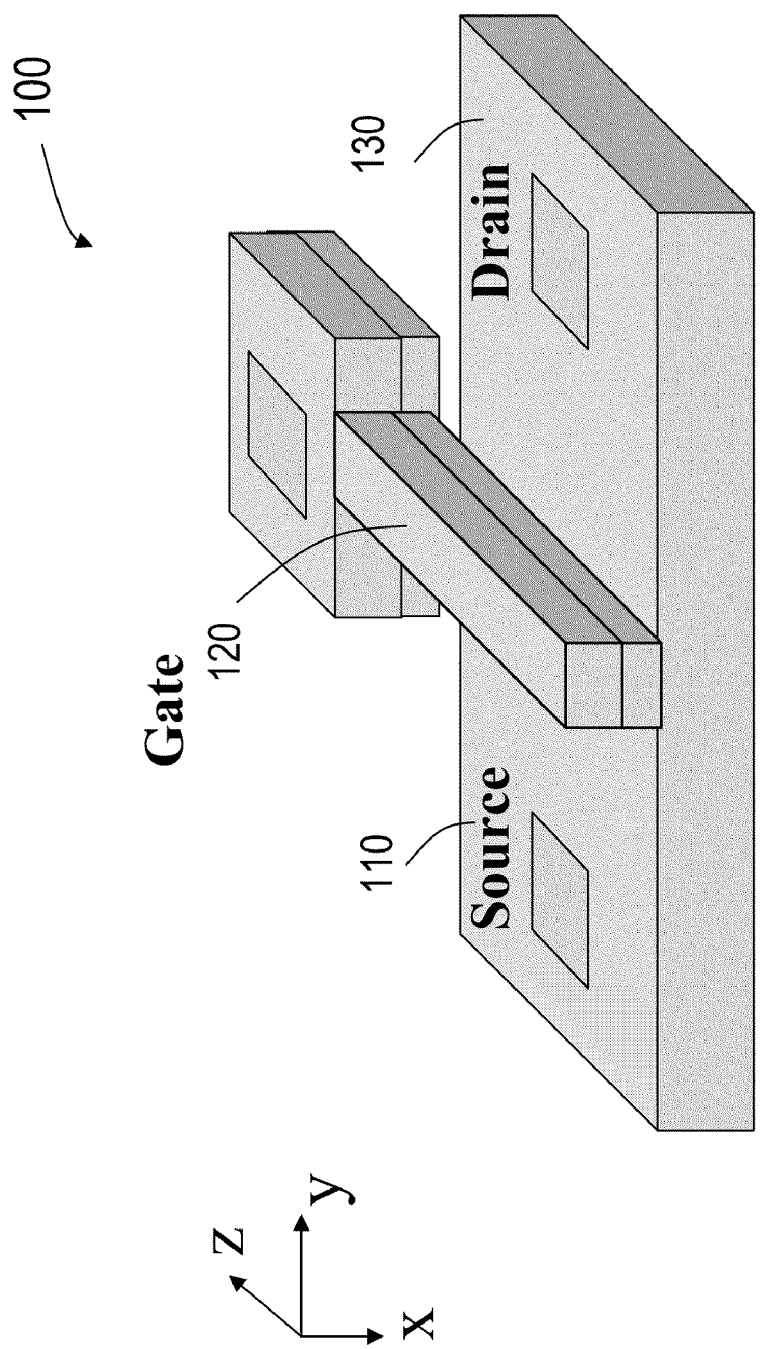
FIG. 1 is a simplified diagram illustrating a convention field effect transistor.

As described earlier, MOSFET with smaller dimension often face design challenges. FIG. 1 is a simplified diagram illustrating a conventional MOSFET. This diagram is merely an example, which should not unduly limit the scope of the claims. One of ordinary skill in the art would recognize many variations, alternatives, and modifications. A MOSFET 100 includes a source 110, a drain 120, and a gate 130. The MOSFET is manufactured on a substrate material. For example, the substrate material includes silicon material.

MOSFETs typically operate in three modes. When Vgs<Vth (Vgs is the voltage differential between the gate and the drain, and Vth is the threshold voltage of the MOSFET), the MOSFET is in the cut-off mode and turned off. At this mode, little or no current is conducted between the source and the drain. Ideally, no current is conducted between the source and the drain. However, small current (i.e., weak-inversion current) may flow between the source and the drain. Such smaller current are sometimes referred to as subthreshold voltage.

When Vgs>Vth and Vds<Vgs−Vth (Vds is the voltage differential between the drain and source), the MOSFET operates in a linear mode. At the linear mode, current is connected between the drain and the source, and the current flow depends on the gate voltage. Typically, there is a voltage drop between the drain and the source.

When Vgs>Vth and Vds>Vgs−Vth, the MOSFET operates in a saturation mode, and current flows between the drain and the source through a channel. Typically, the current flow is independent of the drain voltage and controlled by the gate voltage.

Now referring back to FIG. 1. The MOSFET 100 as illustrated is conventional in its design and suffers various performance problems as the channel length is reduced. For example, for a MOSFET with a channel length of 90 nanometers or less, short channel effect dominates. Typically, performance issues include reduced gate threshold voltage (Vgs), velocity saturation, reduced gain, etc. Typically, a "short channel" model is used for modeling MOSFETs with scaled down dimensions.

Figure 2:
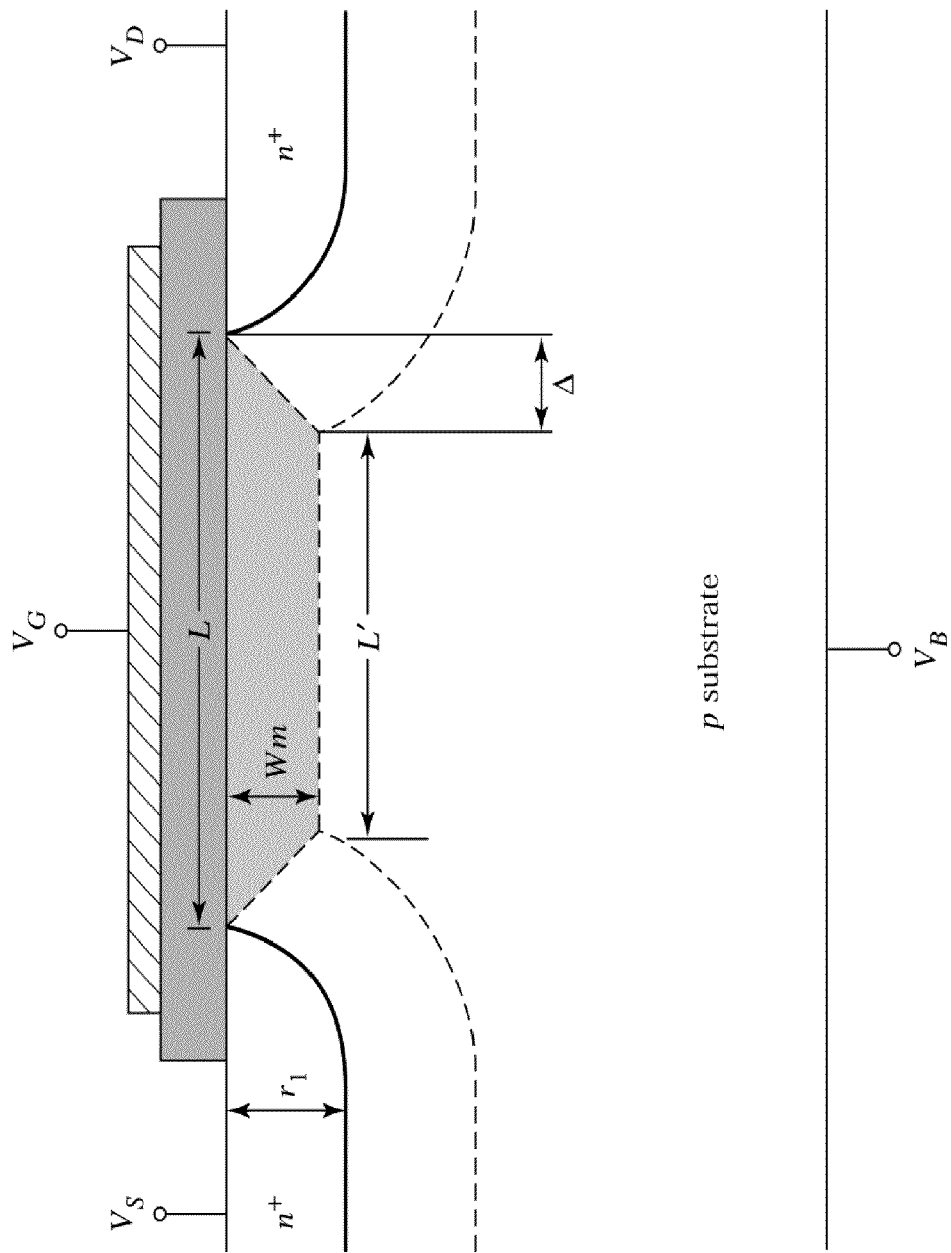
FIG. 2 is a simplified diagram illustrating the "short channel" effect and the charge sharing model used thereof.

FIG. 2 is a simplified diagram illustrating the "short channel" effect and the charge sharing model used thereof. This diagram is merely an example, which should not unduly limit the scope of the claims. One of ordinary skill in the art would recognize many variations, alternatives, and modifications. As can be seen in FIG. 2, the effective channel length (L') of a MOSFET is reduced from the original channel length (L) due to short channel effect. For certain applications, the effective channel length can be as small as a few atoms.

Figure 3:
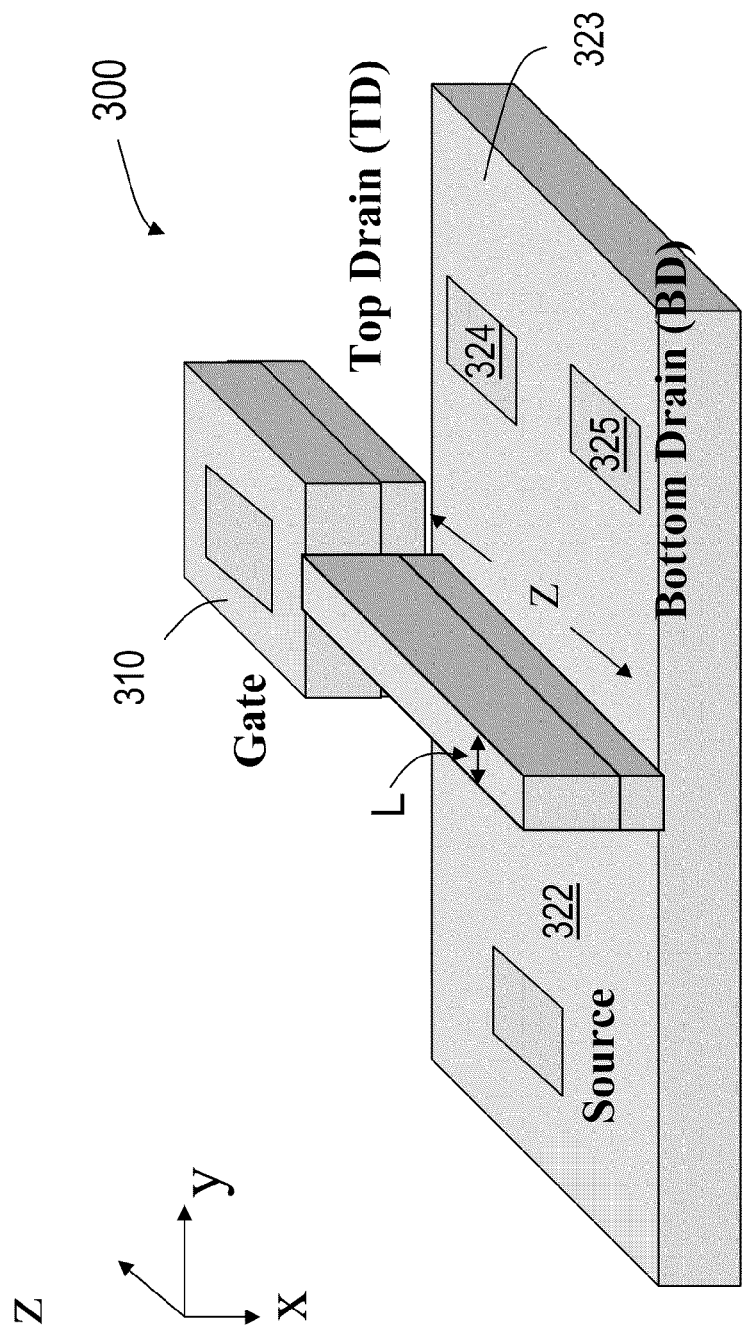
FIG. 3 is a simplified diagram illustrating a MOSFET according to an embodiment of the present invention.

It is therefore to be appreciated that according to certain embodiments, the present invention ameliorates and/or eliminates the abovementioned problems. FIG. 3 is a simplified diagram illustrating a MOSFET according to an embodiment of the present invention. This diagram is merely an example, which should not unduly limit the scope of the claims. One of ordinary skill in the art would recognize many variations, alternatives, and modifications. A MOSFET 300 includes gate 310, a source portion 322, and a drain portion 323. As shown, two drain contacts 324 and 325 are provided. The dual drain contact structure improves the performance of the MOSFET 300. It is to be understood that dual drain contact structure as shown in FIG. 3 merely provides an example. According to a specific embodiment, three or more drain contacts are provided within the drain region 323. According to another specific embodiment, more than one source contacts are provided within the source region 322.

In some embodiments, the drain contacts are coupled to separate drain regions isolated by well doping. In other embodiments, two drain regions may be located in a region of the same conductivity type, but have different doping concentration. In either case, the dual drain (DD) or multiple drain FET enables independent biasing and provides the ability to dynamically adjust the threshold voltage and sub-threshold swing (SS). In some embodiments, the dual drain metal-oxide-semiconductor field effect transistor is referred to as a DD MOSFET.

An embodiment of the present invention provides a field effect transistor (FET), which includes a substrate material characterized by a first conductivity type and having a first portion, a second portion, and a third portion, the third portion being positioned between the first portion and the second portion. For example, the first portion can be a region in the substrate which includes the source region, the second portion of the substrate may include a channel region, and the third portion may include the drain region. In an embodiment, a source portion is positioned within the first portion and characterized by a second conductivity type, which is opposite of the first conductivity type. A first drain portion is positioned within second portion and characterized by the second conductivity type and a first doping concentration. A second drain portion is positioned within the second portion and is characterized by the second conductivity type and a second doping concentration, the second doping concentration being different from the first doping concentration. A first dielectric material overlaying all of the third portion and partially overlaying the source portion, the first dielectric material also partially overlaying the first and the second drain portions. The FET also includes a conducting material overlaying the first dielectric material, the conducting material being configured to provide a gate contact.

Figure 4A:
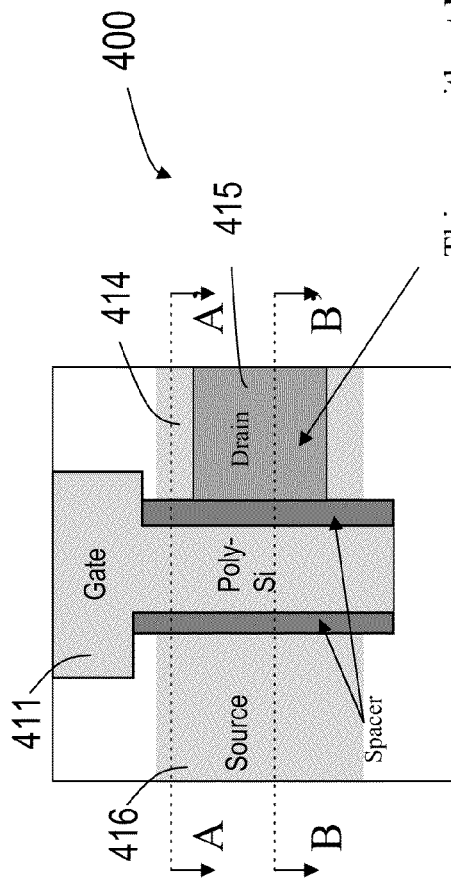
FIGS. 4A and 4B are simplified diagrams illustrating an MOSFET according to an embodiment of the present invention.
Figure 4B:
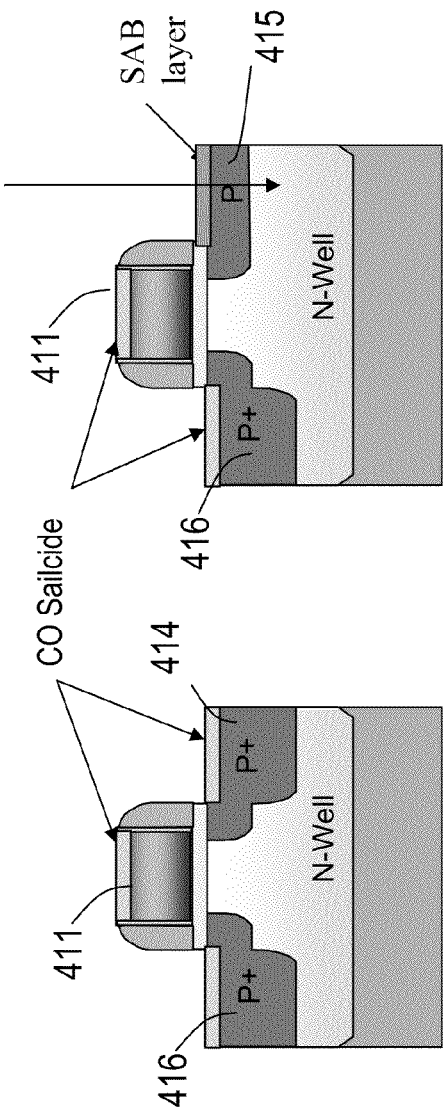

FIGS. 4A and 4B are simplified diagrams illustrating an MOSFET according to an embodiment of the present invention. These diagrams are merely examples, which should not unduly limit the scope of the claims. One of ordinary skill in the art would recognize many variations, alternatives, and modifications. In FIGS. 4A and 4B, MOSFET 400 is shown in three views: a top view in FIG. 4A and cross-sectional views in FIG. 4B, and. The MOSFET 400, as respectively shown in three views, includes a gate portion 411, a source 416, a first drain 414 and a second drain 415. According to a specific embodiment, the drain 414 and the drain 415 are different contacts of a same drain. According to another specific embodiment, the drain 414 and the drain 415 can be two separate drains.

According a specific embodiment, the drain 414 and the drain 415 can implemented with different materials. For example, the drain 414 includes a region 454 doped with p+ materials and is covered by a cobalt salicide layer, and the drain 415 includes a region 455 without doping of p+ materials and is covered by salicide block layer. As another example, the region 415 is doped with dopants at a concentration that is different from the doping concentration of dopants at the region 414. In an embodiment, the second drain area is covered by salicide block layer (SAB oxide) underneath without P+ implant.

In an embodiment, the first drain portion is characterized by a higher doping concentration than the second drain portion.

In another embodiment, each of the source portion and the first drain portion comprises lightly-doped drain dopants and heavily doped drain dopants, and the second drain portion is free from the heavily doped drain dopants.

In another embodiment, the heavily doped drain dopants are blocked from the second drain portion with a silicide blocking layer.

In another embodiment, the first drain portion comprises a first region and a second region disposed on either side of the second drain portion.

In another embodiment, the second drain portion is configured to receive a bias voltage to modify a current flow between the source portion and the first drain portion.

In another embodiment, the second drain portion is configured to receive a bias voltage to modify a subthreshold current flow between the source portion and the first drain portion.

In another embodiment, the first conductivity type is p-type.

In another embodiment, the FET also includes a first layer overlaying the source portion, a second layer overlaying the first drain portion, the second layer including a first material, and a third layer overlaying the second drain portion and including a second material, the second material being different from the first material.

In another embodiment, the first material is a silicide material, and the second material is a silicide blocking layer material.

In another embodiment, the FET also includes a first drain contact overlaying the first drain portion and a second drain contact overlaying the second drain portion, the second drain contact being located away from the first drain contact at a first distance.

In another embodiment, the first drain contact is electrically coupled to a first voltage supply and the second drain contact is electrically coupled to a second voltage supply.

Another embodiment of the invention provides a field effect transistor (FET) which includes a substrate material characterized by a first conductivity type and including a first portion, a second portion, and a third portion, with the third portion positioned between the first portion and the second portion. A source portion is positioned within the first portion and characterized by a second conductivity type, which is opposite of the first conductivity type. A first drain portion is positioned within second portion and characterized by the second conductivity type and a first doping concentration. A second drain portion is positioned within the second portion and characterized by the second conductivity type and a second doping concentration The second drain portion is formed with a different material from the first drain portion. A first dielectric material overlaying all of the third portion, the first dielectric material partially overlaying the source portion, the first dielectric material partially overlaying the first and the second drain portions. A conducting material overlaying the first dielectric material, the conducting material being configured to provide a gate contact.

An alternative embodiment provides a field effect transistor (FET), which includes a substrate material characterized by a first conductivity type and including a first portion, a second portion, and a third portion, with the third portion being positioned between the first portion and the second portion. A drain portion is positioned within the first portion and being characterized by a second conductivity type, wherein the second conductivity type being opposite of the first conductivity type. A first source portioned is positioned within the second portion and being characterized by the second conductivity type and a first doping concentration, A second source portioned positioned within the second portion and being different from the first source portion. The second source portion is characterized by the second conductivity type and a second doping concentration. A first dielectric material overlaying all of the third portion and partially overlaying the first and the second source portions. The first dielectric material also partially overlies the drain portion. The transistor also has a conducting material overlaying the first dielectric material and being configured to provide a gate contact.

In an embodiment, the first source portion comprises p+ implants, the second source portion is free from p+ implants, and the first conductivity type is n-type. In another embodiment, the first conductivity is p-type. In yet another embodiment, the dopants of the first concentration comprise lightly doped drain dopants.

FIGS. 5A-5D are simplified three-dimensional diagrams illustrating energy band on an n channel MOSFET according to an embodiment of the present invention. These diagrams merely provide an example, which should not unduly limit the scope of the claims. One of ordinary skill in the art would recognize many variations, alternatives, and modifications. For example, the diagrams illustrates energy bands when voltage are applied to MOSFET with two drains. It is to be noted that according to an another embodiment, different voltages are applied two sources.

Figure 5:
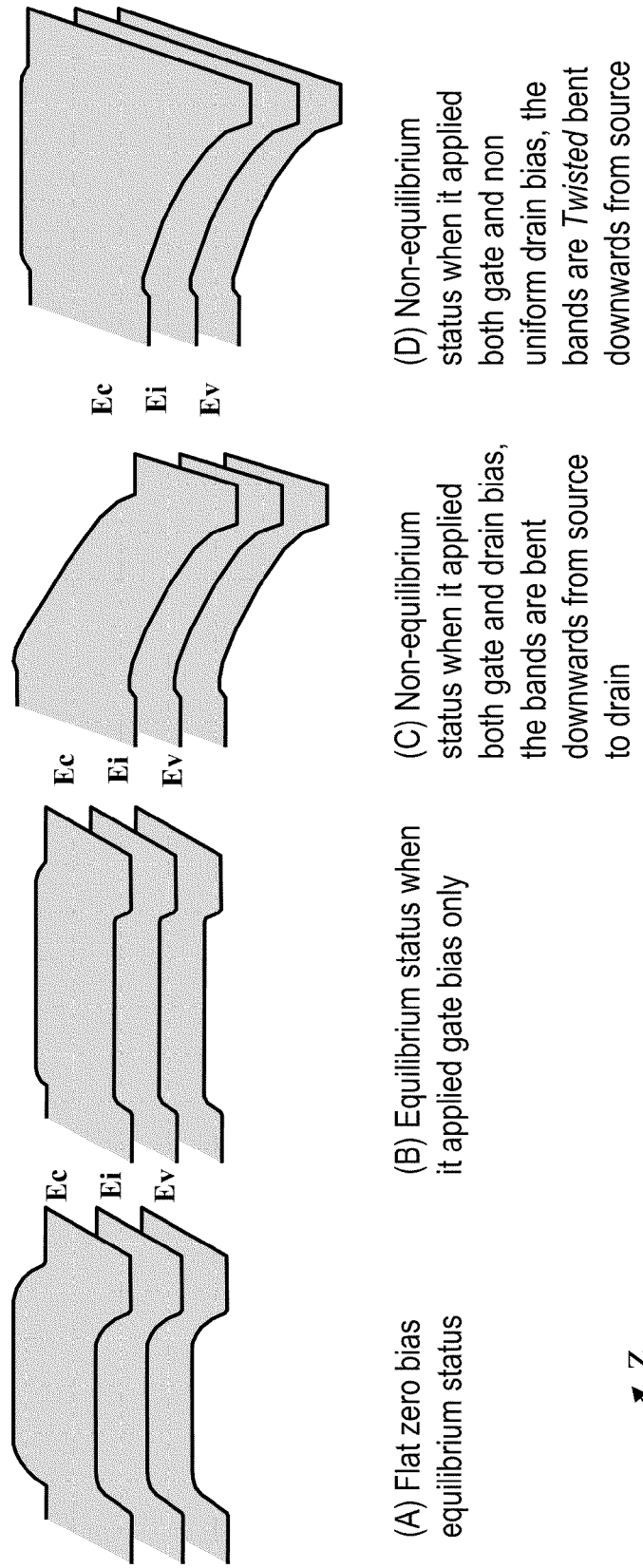
FIGS. 5A-5D are simplified three-dimensional diagrams illustrating energy band on an n channel MOSFET according to an embodiment of the present invention.

FIG. 5A illustrates the energy banding when the MOSFET is at a equilibrium state and no bias voltage is applied to the MOSFET.

FIG. 5B illustrates the energy banding when the MOSFET is at a equilibrium state and with bias voltage applied to the gate.

FIG. 5C illustrates the energy banding when the MOSFET is at a non-equilibrium status. Voltage are applied to both gate and the drains, with each of the two drains receiving the same voltage. As can be seen from FIG. 5C, due the same voltage that is applied to both drains, the energy bands are bent downwards from source to drain.

FIG. 5D illustrates the energy banding when the MOSFET is at a non-equilibrium status with different voltages applied to two drains. As can be seen from the diagram, energy bands are bent downwards from source to drain.

Figure 6A:
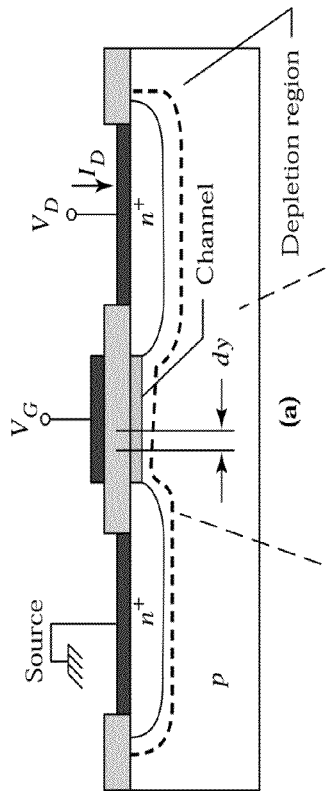
FIGS. 6A-6C are simplified diagrams illustrating operation of a MOSFET according to an embodiment of the present invention.
Figure 6B:
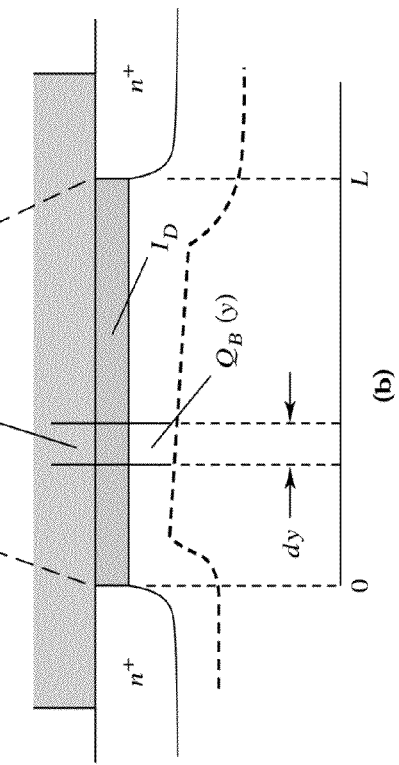
Figure 6C:
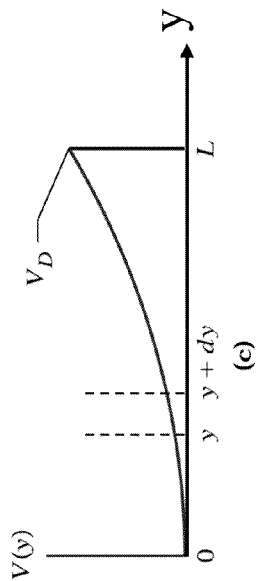

FIGS. 6A-6C are simplified diagrams illustrating operation of a MOSFET according to an embodiment of the present invention. These diagrams are merely an examples, which should not unduly limit the scope of the claims. One of ordinary skill in the art would recognize many variations, alternatives, and modifications. As shown in FIG. 6A, voltages are applied to the gate and the drain of the MOSFET while the source is biased at ground.

FIG. 6B a simplified diagram illustrating the current v. voltage characteristic of a MOSFET according to an embodiment of the present invention. This diagram is merely an example, which should not unduly limit the scope of the claims. One of ordinary skill in the art would recognize many variations, alternatives, and modifications. As can be seen in FIG. 6B, due to voltage applied at the drain, the drain side of the MOSFET has a higher potential as compared to the source side.

FIG. 6C illustrates the electric potential along the channel region.

Figure 7A:
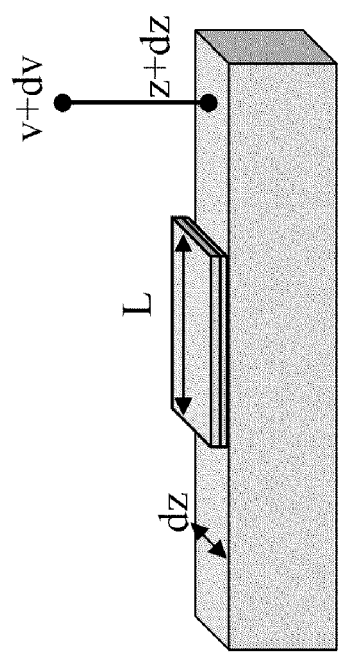
FIGS. 7A and 7B are a simplified diagrams illustrating operation of a MOSFET according to an embodiment of the present invention.
Figure 7B:
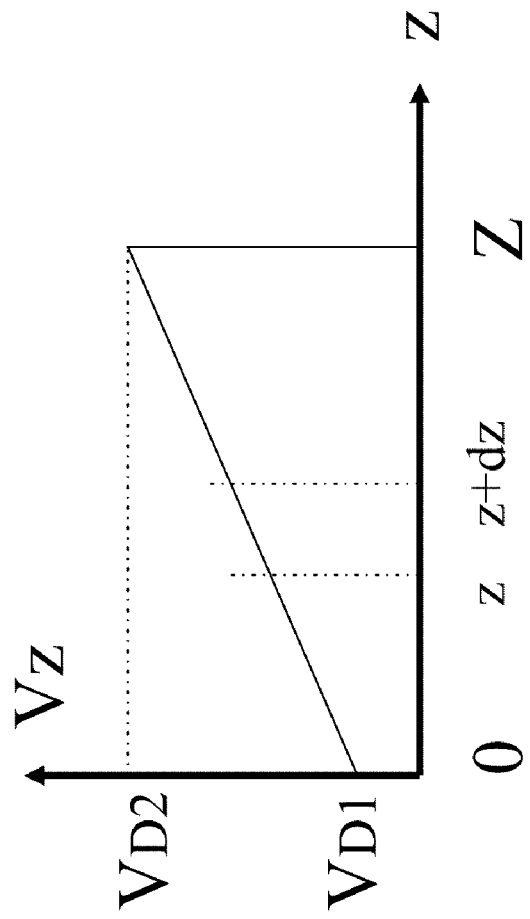

FIGS. 7A and 7B are a simplified diagrams illustrating operation of a MOSFET according to an embodiment of the present invention. These diagrams merely provide an example, which should not unduly limit the scope of the claims. One of ordinary skill in the art would recognize many variations, alternatives, and modifications. FIG. 7A illustrates a structure of an MOSFET. FIG. 7B illustrates different voltages VD1 and VD2 are applied to the first and second drains of the MOSFET. For example, at position z, a voltage VD1 is applied, and at a position z+dz, a voltage VD2 is applied.

To further illustrate the operation of various embodiments of the present inventions, various equations and formulae are used. In the process of illustrating the present invention, the following assumptions are made to model a MOSFET according to various embodiments of the present invention:
  1. The gate structure corresponds to an ideal MOS diode;
  2. Drift current is considered;
  3. Carrier mobility in the inversion layer is constant;
  4. Doping of the channel is uniform;

5. Reverse leakage current is negligible; and
6. The transverse field created by the gate voltage (perpendicular to the current flow) is much greater than the longitudinal field created by the drain voltage (parallel to the current flow).

In addition, since according to various embodiments the drain region is able to receive two or more voltages, the current flow along the drain region is non-uniform.

The surface charge can be expressed as the following:

$$Q_s(y,z) = -[V_g - \Psi_s(y,z)]C \quad \text{Equation 1}$$

In Equation 1, Qs represents total surface charge as a given position, Vg represents voltage potential at the gate, and the Ψs represents surface potential at a given point. The surface charge per unit area (Qn) can be expressed as the following:

$$Q_n(y,z) = Q_s(y,z) - Q_{sc}(y,z) \quad \text{Equation 2}$$

By manipulating Equation 1 and Equation 2, the surface charge per unit area can be expressed as the following:

$$Q_n(y,z) = -[V_G - \psi_s(y,z)]C_o - Q_{sc}(y,z) \quad \text{Equation 3}$$

At inversion, the surface potential can be approximated by the ideal MOS model as the following:

$$Q_{sc}(y,z) = -eN_A W_m \cong -\sqrt{2\epsilon_s eN_A[2\psi_B + V(y,z)]} \quad \text{Equation 4}$$

By substituting Equation 4 into Equation 3, the surface charge per unit area can be expressed as the following:

$$Q_n(y,z) \cong -[V_G - V(y,z) - 2\psi_B]C_o + \sqrt{2\epsilon_s eN_A[2\psi_B + V(y,z)]} \quad \text{Equation 5}$$

The conductivity of the channel at a position y can be expressed as the following $$\sigma(x) = en(x)\mu_n(x) \quad \text{Equation 6}$$

When mobility is constant, the channel conductance can be expressed as the following:

$$g = \frac{dz}{L}\int_0^{x_i} \sigma(x)dx = \frac{dz\mu_n}{L}\int_0^{x_i} en(x)dx \quad \text{Equation 7}$$

Equation can alternatively be expressed as the following:

$$g = \frac{dz\mu_n}{L}|Q_n| \quad \text{Equation 8}$$

The resistance of an elemental section of the channel dydz can be expressed as the following:

$$dR = \frac{dy}{gL} = \frac{dy}{\mu_n dz |Q_n(y,z)|} \quad \text{Equation 9}$$

The voltage drop across the same elemental section dy can be expressed as the following:

$$dV = I_D dR = \frac{I_D dy}{dz\mu_n|Q_n(y,z)|} \quad \text{Equation 10}$$

By substituting Equation 5 for Qn(y,z) and integrate from source (y=0, V(y,z)=0) to drain (y=L, V(y,z)=Vz) and from the first drain (z=0, Vz=VD1) to the second drain (z=Z, Vz=VD2), the following expressions are obtained:

$$I_D = \frac{1}{L}\mu_n \int_0^Z \int_0^{V_z} |Q_n(y,z)| dz dV_y \quad \text{Equation 11}$$

$$dz = \frac{Z}{(V_{D2} - V_{D1})} dV_z \quad \text{Equation 12}$$

$$I_D = \frac{Z}{L(V_{D2} - V_{D1})}\mu_n C_o \int_{V_{D1}}^{V_{D2}} \left\{ \left(V_G - 2\psi_B - \frac{V_z}{2}\right)V_z - \frac{2}{3}\frac{\sqrt{2\epsilon_s eN_A}}{C_o}[(V_z + 2\psi_B)^{3/2} - (2\psi_B)^{3/2}] \right\} dV_z \quad \text{Equation 13}$$

$$I_D = \frac{Z}{L(V_{D2} - V_{D1})}\mu_n C_o \left\{ \frac{1}{2}\left(V_G - 2\psi_B - \frac{V_z}{3}\right)V_z^2 - \frac{2}{3}\frac{\sqrt{2\epsilon_s eN_A}}{C_o}\left[\frac{3}{5}(V_z + 2\psi_B)^{5/2} - (2\psi_B)^{3/2}V_z\right]\right\} \quad \text{Equation 14}$$

$$I_D = \frac{Z}{L(V_{D2} - V_{D1})}\mu_n C_o \left\{ \frac{1}{2}\left((V_G - 2\psi_B)(V_{D2}^2 - V_{D1}^2) - \frac{1}{3}(V_{D2}^3 - V_{D1}^3)\right) - \frac{2}{3}\frac{\sqrt{2\epsilon_s eN_A}}{C_o}\left[\frac{3}{5}[(V_{D2} + 2\psi_B)^{5/2} - (V_{D1} + 2\psi_B)^{5/2}] - (2\psi_B)^{3/2}(V_{D2} - V_{D1})\right]\right\} \quad \text{Equation 15}$$

$$I_D = \frac{Z}{L}\mu_n C_o \quad \text{Equation 16}$$

$$\left\{\frac{1}{2}\left((V_G - 2\psi_B)(V_{D1} + V_{D2}) - \frac{1}{3}(V_{D1}^2 + V_{D1}V_{D2} + V_{D2}^2)\right) - \frac{2}{3}\frac{\sqrt{2\epsilon_s eN_A}}{C_o(V_{D2} - V_{D1})}\left[\frac{3}{5}[(V_{D2} + 2\psi_B)^{5/2} - (V_{D1} + 2\psi_B)^{5/2}] - (2\psi_B)^{3/2}(V_{D2} - V_{D1})\right]\right\}$$

$$I_D = \frac{Z}{L}\mu_n C_o \begin{cases} \frac{1}{2}(V_G - 2\psi_B)(V_{D1} + V_{D2}) - \\ \frac{1}{3}(V_{D1}^2 + V_{D1}V_{D2} + V^{2D2}) + \\ \frac{2}{3}\frac{\sqrt{2\epsilon_s eN_A}}{C_o}(2\psi_B)^{3/2} - \\ \frac{2}{5}\cdot\frac{2}{3}\frac{\sqrt{2\epsilon_s eN_A}}{C_o(V_{D2} - V_{D1})}[(V_{D2} + 2\psi_B)^{5/2} - \\ (V_{D1} + 2\psi_B)^{5/2}] \end{cases}$$

$$= \frac{Z}{L}\mu_n C_o \begin{cases} \frac{1}{2}(V_G - 2\psi_B)(V_{D1} + V_{D2}) - \\ \frac{1}{3}(V_{D1}^3 + V_{D1}V_{D2} + V_{D2}^2) + \\ \frac{2}{3}\frac{\sqrt{2\epsilon_s eN_A}}{C_o}(2\psi_B)^{3/2} - \\ \frac{4}{15}\frac{\sqrt{2\epsilon_s eN_A}}{C_o(V_{D2} + 2\psi_B)^{1/2} + (V_{D1} + 2\psi_B)^{1/2}} \\ [(V_{D2} + 2\psi_B)^2 + (V_{D2} + 2\psi_B)^{3/2} \\ (V_{D1} + 2\psi_B)^{1/2} + (V_{D2} + 2\psi_B)(V_{D1} + 2\psi_B) + \\ (V_{D2} + 2\psi_B)^{1/2}(V_{D1} + 2\psi_B)^{3/2} + (V_{D1} + 2\psi_B)^2] \end{cases}$$

-continued $$I_D = \qquad \text{Equation 17}$$

$$\frac{Z}{L}\mu_n C_o \left\{ \begin{array}{l} \frac{1}{2}\left((V_G - 2\psi_B)(V_{D1} + V_{D2}) - \frac{1}{3}(V_{D1}^2 + V_{D1}V_{D2} + V_{D2}^2)\right) + \frac{2}{3}\frac{\sqrt{2\varepsilon_s e N_A}}{C_o}(2\psi_B)^{3/2} - \\ \frac{2}{5}\frac{\sqrt{2\varepsilon_s e N_A}}{C_o(V_{D2} + 2\psi_B)^{1/2} + (V_{D1} + 2\psi_B)^{1/2}} \\ {[(V_{D2} + 2\psi_B)^2 +} \\ (V_{D2} + 2\psi_B)^{3/2}(V_{D1} + 2\psi_B)^{1/2} + \\ (V_{D2} + 2\psi_B)(V_{D1} + 2\psi_B) + \\ (V_{D2} + 2\psi_B)^{1/2}(V_{D1} + 2\psi_B)^{3/2} + (V_{D1} + 2\psi_B)^2] \end{array} \right\}$$

$$I_D = \qquad \text{Equation 18}$$

$$\frac{Z}{L}\mu_n C_o \left\{ \begin{array}{l} \frac{1}{2}\left((V_G - 2\psi_B)(V_{D1} + V_{D2}) - \frac{1}{3}(V_{D1}^2 + V_{D1}V_{D2} + V_{D2}^2)\right) - \\ \frac{4}{15}\frac{\sqrt{2\varepsilon_s e N_A}}{C_o(V_{D2} + 2\psi_B)^{1/2} + (V_{D1} + 2\psi_B)^{1/2}} \\ \{(V_{D2} + 2\psi_B)^2 + \\ (V_{D2} + 2\psi_B)^{3/2}(V_{D1} + 2\psi_B)^{1/2} + \\ (V_{D2} + 2\psi_B)(V_{D1} + 2\psi_B) + \\ (V_{D2} + 2\psi_B)^{1/2}(V_{D1} + 2\psi_B)^{3/2} + (V_{D1} + 2\psi_B)^2 - \\ \frac{5}{2}(2\psi_B)^{3/2}[(V_{D2} + 2\psi_B)^{1/2} + (V_{D1} + 2\psi_B)^{1/2}]\} \end{array} \right\}$$

Equation 18 accounts for different drain voltages. To illustration the relationship between embodiments of the present invention and the conventional technologies, it is possible to compare Equation 18 with conventional MOSFET equations. By making Vd1=Vd2=Vd, the following equation for I-V characteristic is obtained:

$$I_D = \frac{Z}{L}\mu_n C_o \left\{ \left((V_G - 2\psi_B)V_D - \frac{1}{2}V_D^2\right) - \frac{2}{3}\frac{\sqrt{2\varepsilon_s e N_A}}{C_o}\left[(V_D + 2\psi_B)^{\frac{3}{2}} - (2\psi_B)^{3/2}\right] \right\} \qquad \text{Equation 19}$$

As shown above, the conventional mathematical model for MOSFET confirms the derivation of Equation 18 according to the present invention.

Figure 8:
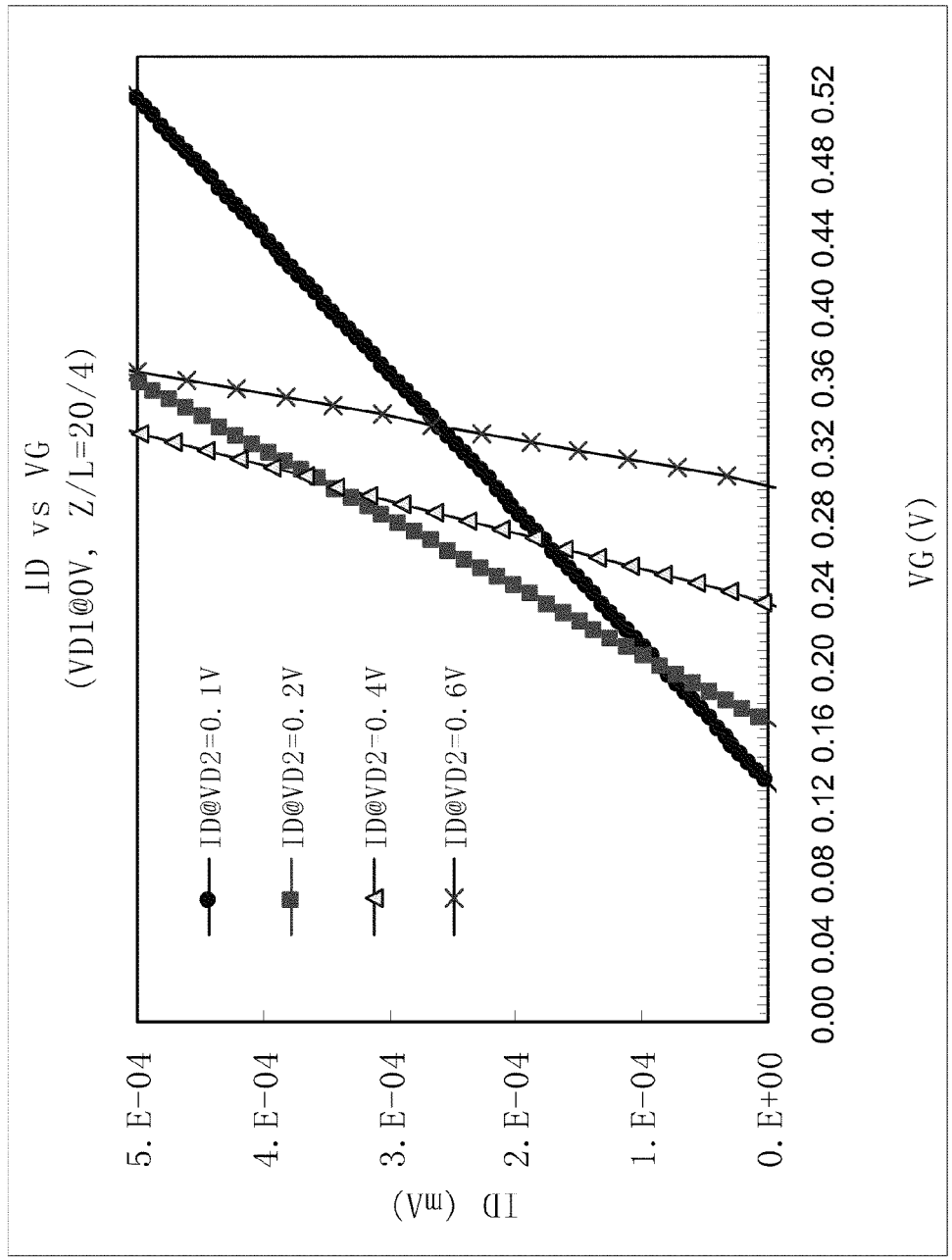
FIGS. 8-10 are graphs illustrating I-V characteristics of a MOSFET according to an embodiment of the present invention.
Figure 9:
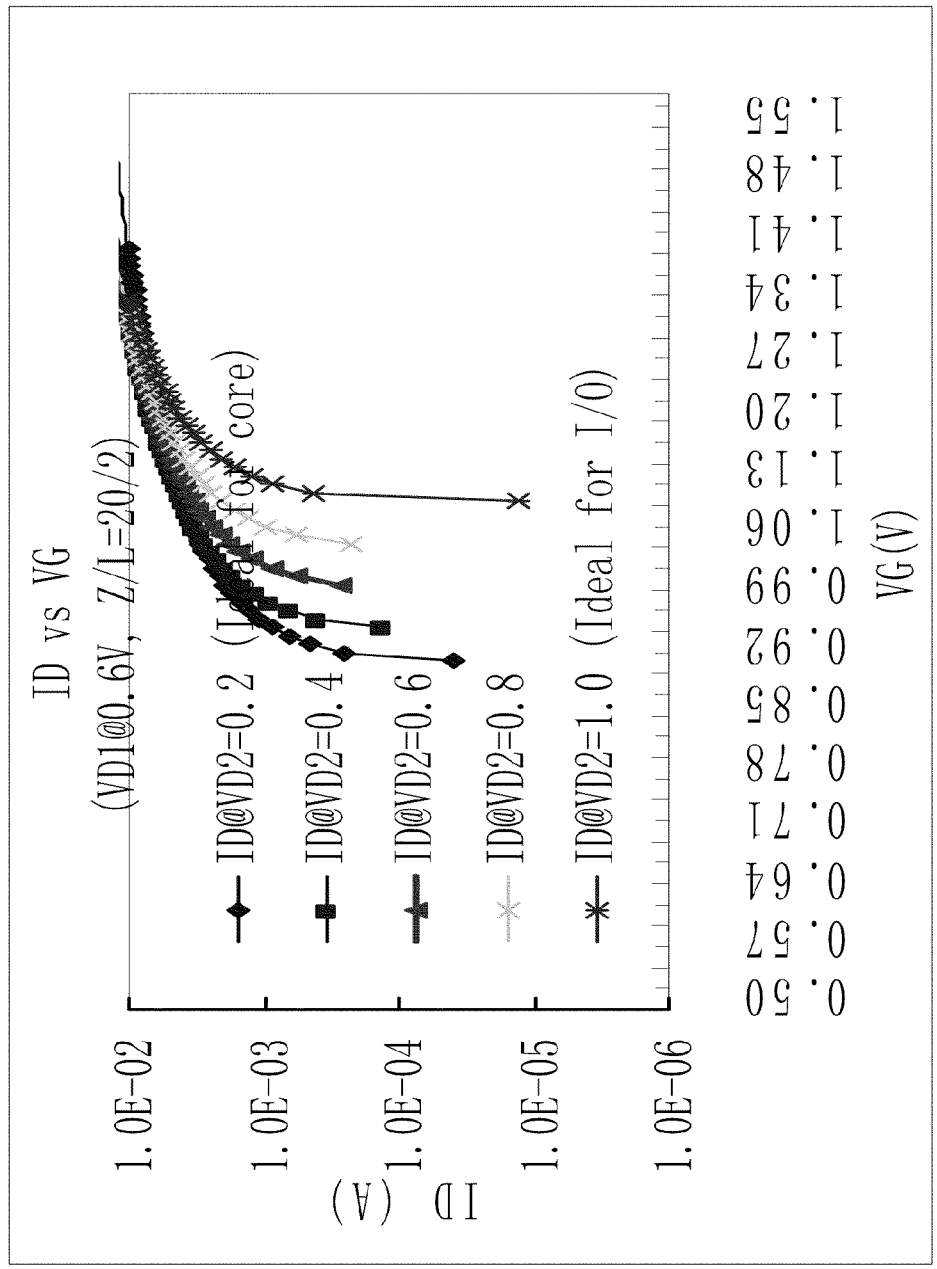
Figure 10:
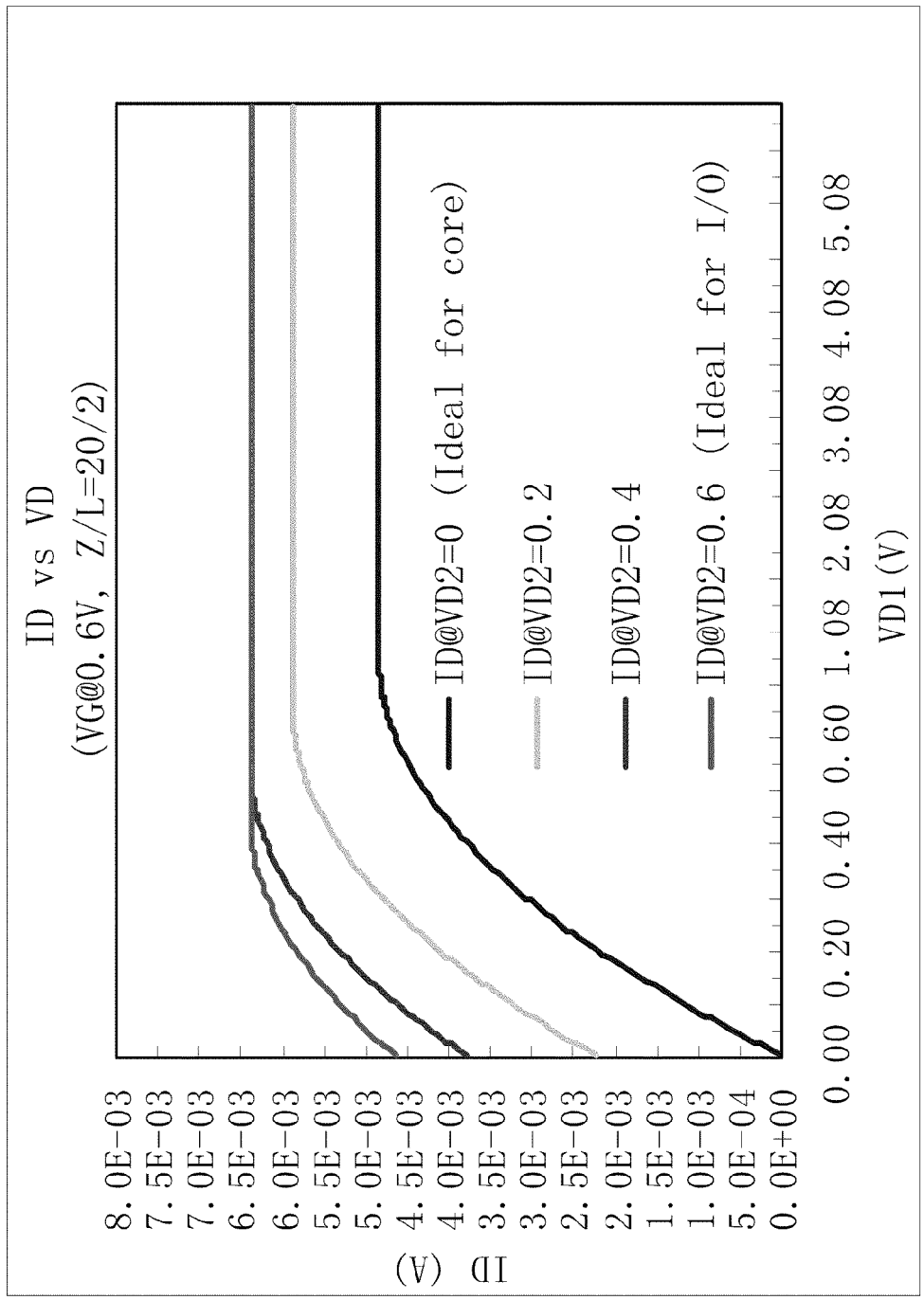

FIGS. 8-10 are graphs illustrating I-V characteristics of a MOSFET according to an embodiment of the present invention. The graphs merely provide an example, which should not unduly limit the scope of the claims. One of ordinary skill in the art would recognize many variations, alternatives, and modifications. As shown, the two independent dual drains provide dynamical control on device characteristics such as threshold voltage (Vt) and sub-threshold swing (SS).

Some embodiments of the invention provide a method for manufacturing a field effect transistor (FET). The method includes providing a semiconductor substrate and forming isolation regions to define an active device region. The method also includes forming a gate dielectric overlying the active device region and forming a gate structure overlying a portion of the gate dielectric and separating the active device region into a source region and a drain region. The method further includes implanting dopants of the first concentration into the source and drain regions, forming a mask layer over a portion of the drain region, and implanting dopants of the second concentration into the source region and a portion of the drain region not masked by the masking layer. The method also includes forming a first drain contact to the first drain region and a second contact to the second drain region, the first drain contact being isolated from the second drain contact.

In an embodiment, the above method also includes forming a silicide material overlying the source region and the portion of the drain region not masked by the masking layer.

In another embodiment, the masking layer comprises a silicide making layer.

In another embodiment, the dopants of the first concentration comprise lightly doped drain dopants.

It is to be appreciated that a dual-drain MOSFET can be manufactured using commercially available equipments according to various embodiments of the present invention. The methods provided by embodiments of the invention are relative simple compared with conventional planar technology, which requires fabricating multiple transistors, each with a different gate oxide thickness and doping to get different Vt (threshold voltages). In contrast, using the dual drain transistor, only one kind of transistor is needed and also the short-channel effect can be effectively controlled. Depending on the embodiments, the transistor can operate with different Vt, or with both drains tied together to have better performance of the device.

In a specific embodiment, the following steps are performed during the manufacturing process:
1. Trench Isolation/chemical mechanical polishing (CMP)
2. Well Definition
3. Gate Formation
4. Lightly doped drain (LDD) and Spacer Formation
5. N/PMOS Formation
6. Self-aligned silicide (tSalicide) Formation
7. Interlevel dielectric (ILD) Layer
8. Contact (CT) and Dual Drain Formation
9. Metal 1 (M) Layer
10. Vial to Top metal layer
11. Passivation It is to be understood that the process flow above are simplified for illustration, and various steps may be added, removed, replaced, modified, repeated, and/or rearranged.

Figure 11:
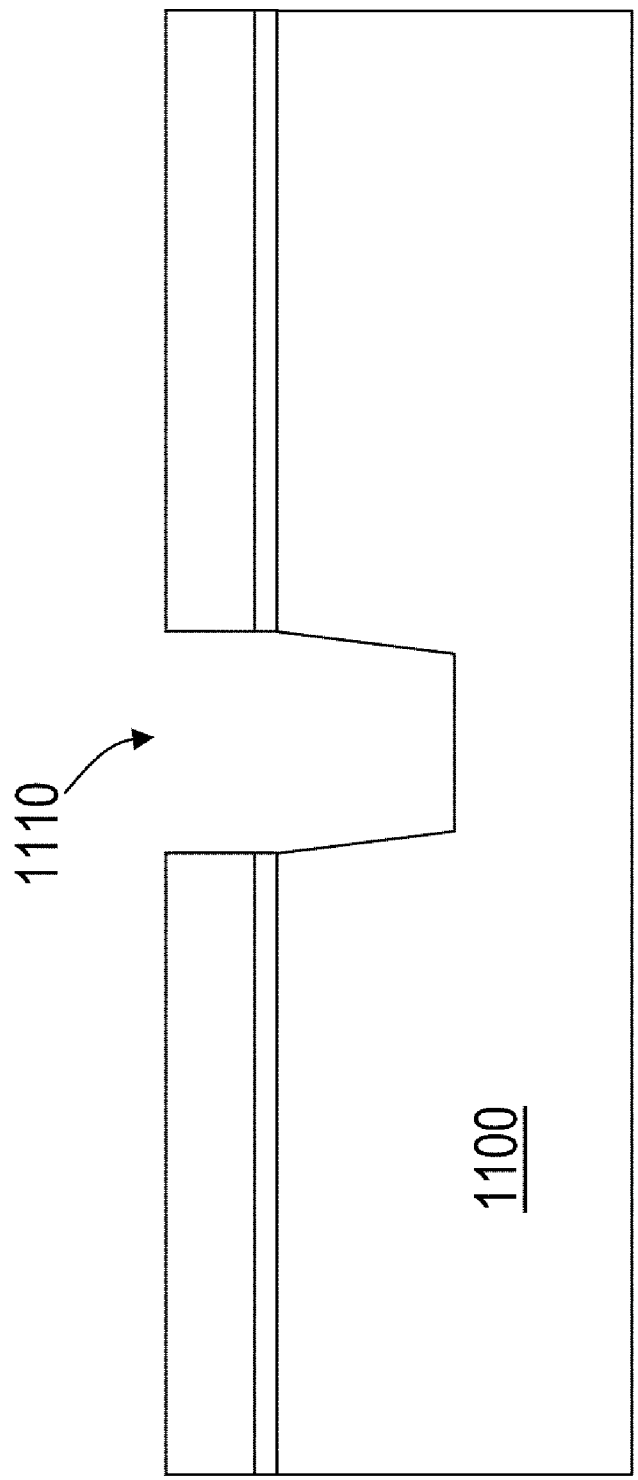
FIG. 11 is a simplified diagram illustrating a process for performing trench isolation.

FIG. 11 is a simplified diagram illustrating a process for performing trench isolation. This diagram is merely an example, which should not unduly limit the scope of the claims. One of ordinary skill in the art would recognize many variations, alternatives, and modifications. As shown, a trench structure 1110 is formed on a substrate material 1100. The trench structure is used as isolation and to define active device areas in which devices such as transistors are formed.

Figure 12:
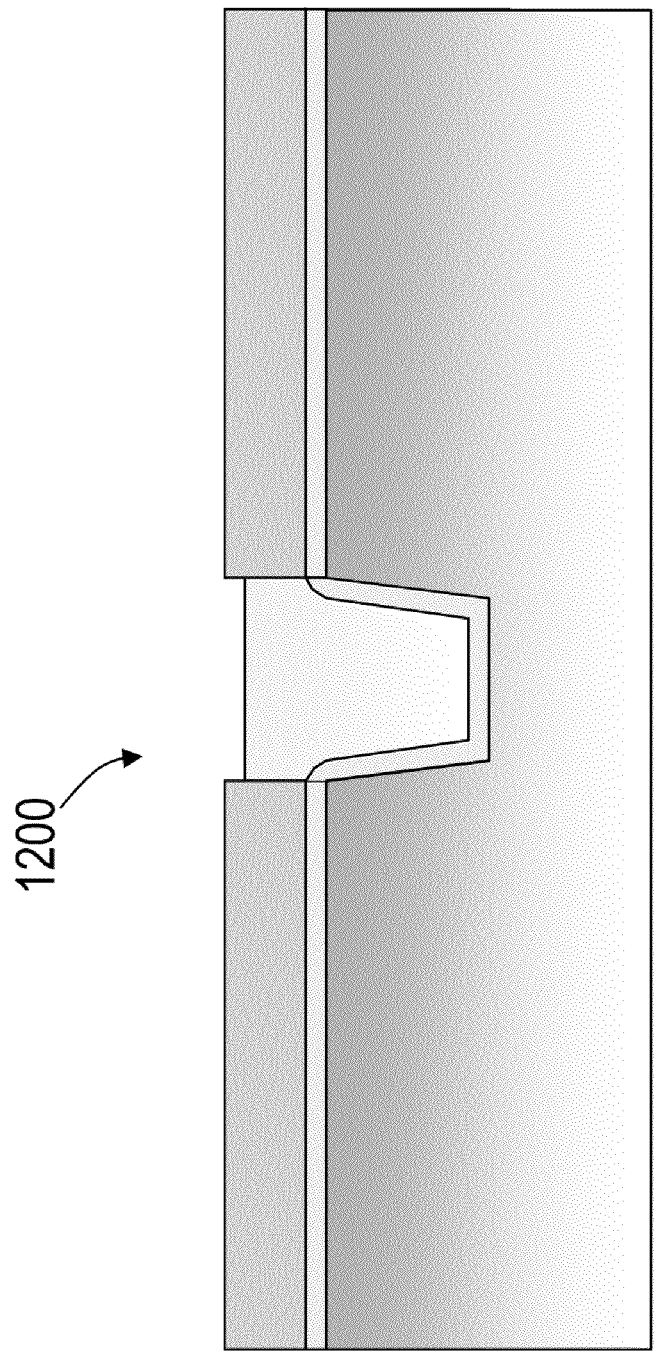
FIG. 12 is a simplified diagram illustrating a process for performing chemical mechanical polishing (CMP).

FIG. 12 is a simplified diagram illustrating a process for performing chemical mechanical polishing (CMP). This diagram is merely an example, which should not unduly limit the scope of the claims. One of ordinary skill in the art would recognize many variations, alternatives, and modifications. As shown in FIG. 12, the trench structure in filled and planarized with a CMP process.

Figure 13:
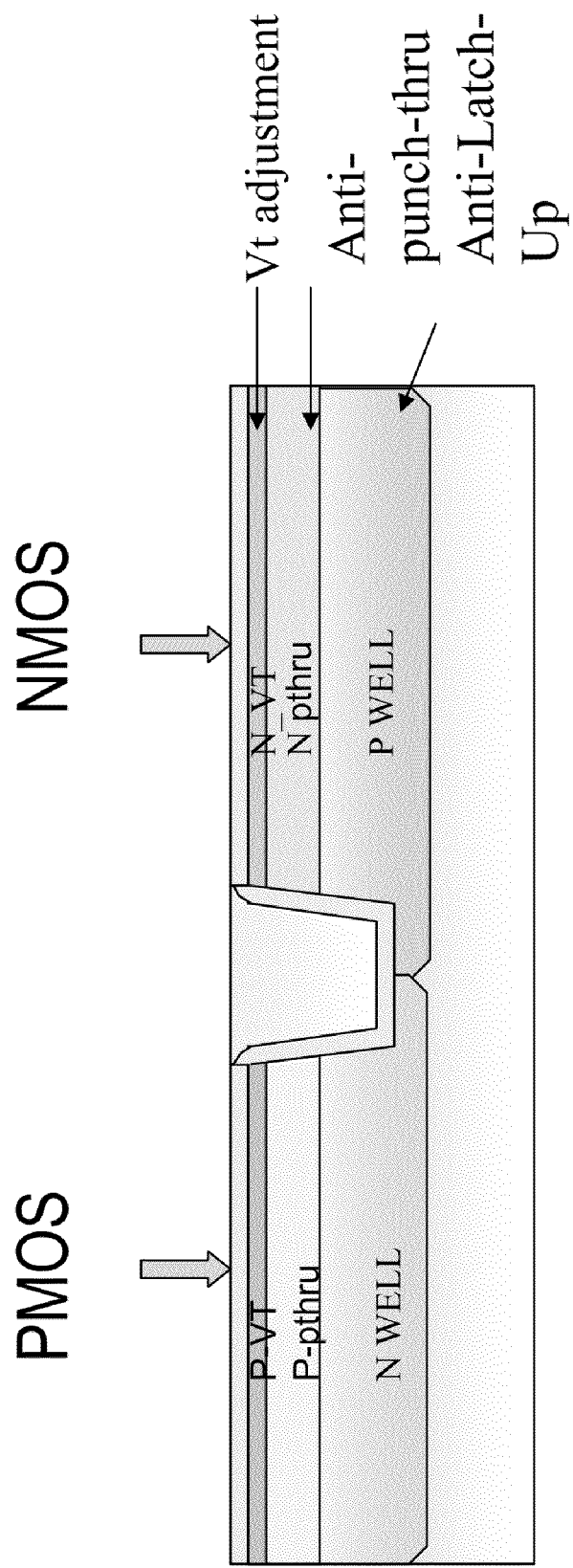
FIG. 13 is a simplified diagram illustrating a process for performing well definition.

FIG. 13 is a simplified diagram illustrating a process for performing WELL definition. This diagram is merely an example, which should not unduly limit the scope of the claims. One of ordinary skill in the art would recognize many variations, alternatives, and modifications. For illustration purposes, an NMOS and a PMOS are positioned on either side of the trench isolation region.

Figure 14:
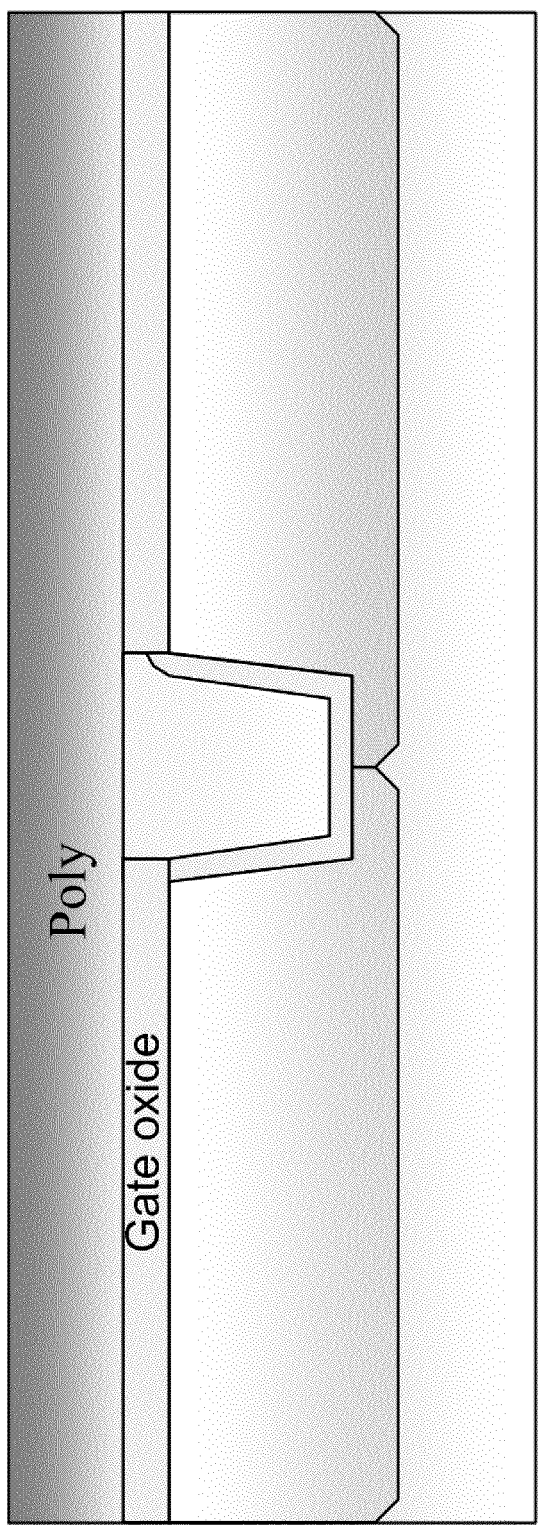
FIGS. 14-15 are a simplified diagrams illustrating a process for performing gate formation.
Figure 15:
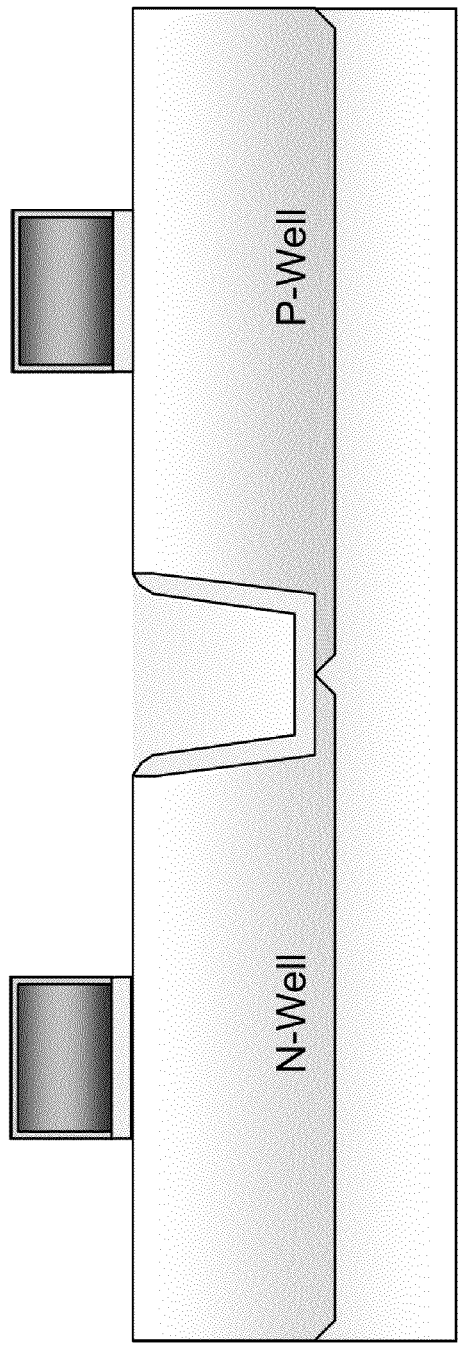

FIGS. 14-15 are a simplified diagrams illustrating a process for performing gate formation. These diagrams merely provide an example, which should not unduly limit the scope of the claims. One of ordinary skill in the art would recognize many variations, alternatives, and modifications. In FIGS. 14-15, gate oxide and polysilicon gates are formed.

Figure 16:
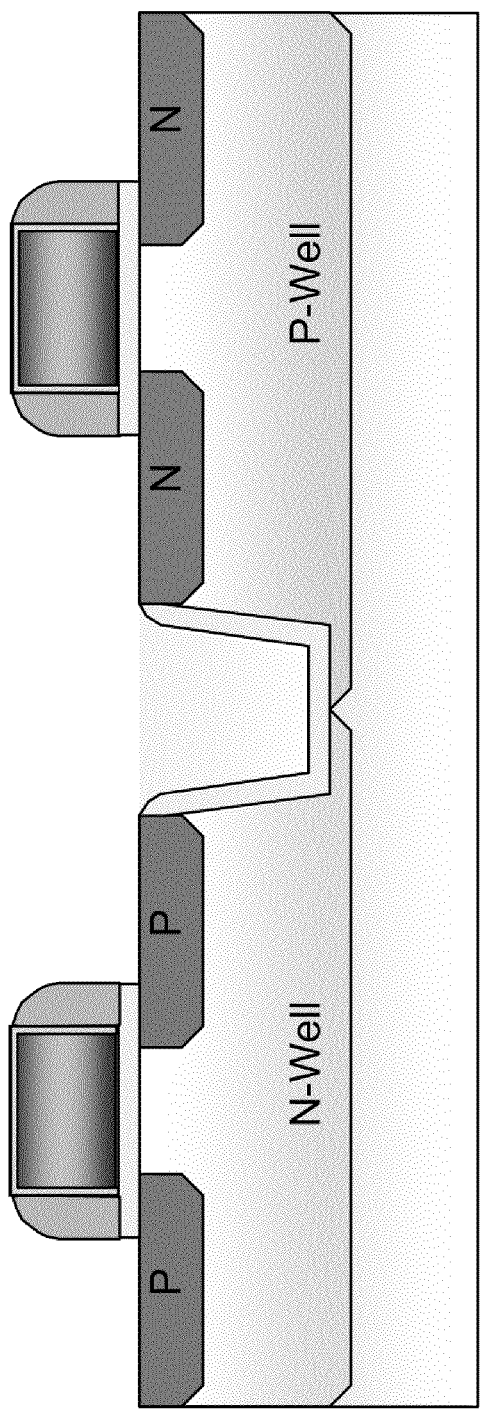
FIG. 16 is a simplified diagram illustrating a process for performing LSS and spacer formation.

FIG. 16 is a simplified diagram illustrating a process for performing LDD and spacer formation. This diagram is merely an example, which should not unduly limit the scope of the claims. One of ordinary skill in the art would recognize many variations, alternatives, and modifications.

Figure 17:
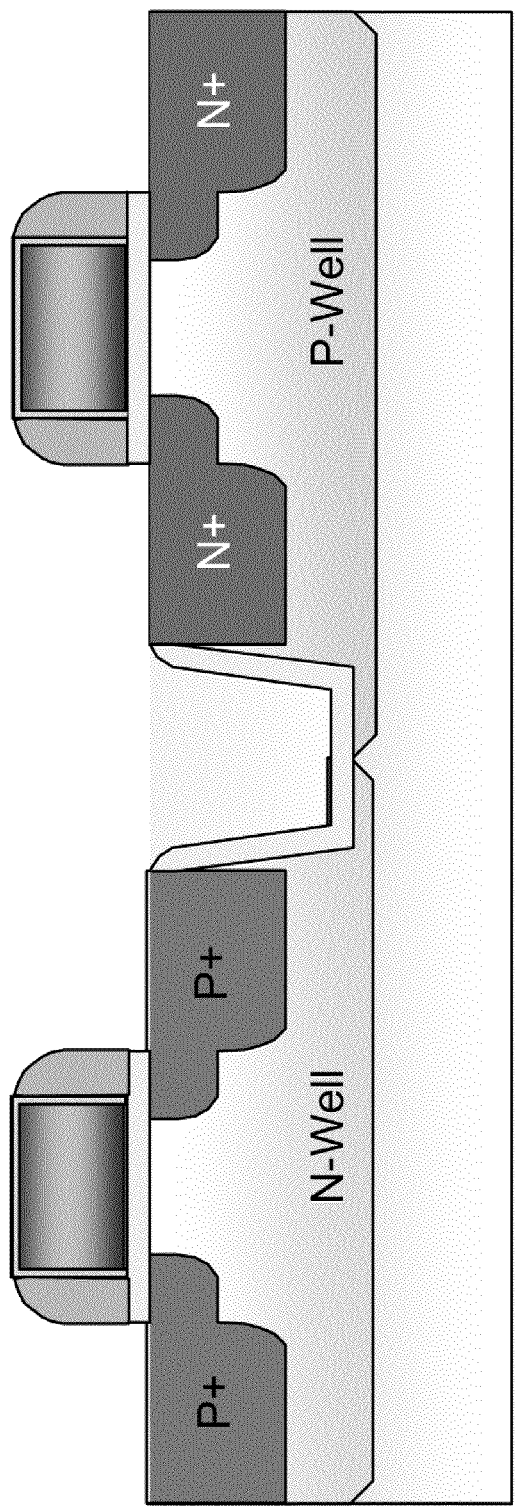
FIG. 17 is a simplified diagram illustrating a process for performing N/PMOS formation.

FIG. 17 is a simplified diagram illustrating a process for performing N/PMOS drain regions formation. This diagram is merely an example, which should not unduly limit the scope of the claims. One of ordinary skill in the art would recognize many variations, alternatives, and modifications.

Figure 18A:
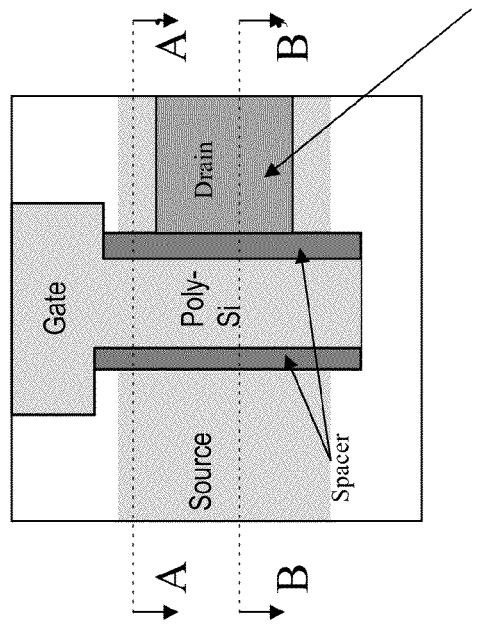
FIGS. 18A and 18B illustrate a process for performing salicide and dual drain formation according to an embodiment of the present invention.
Figure 18B:
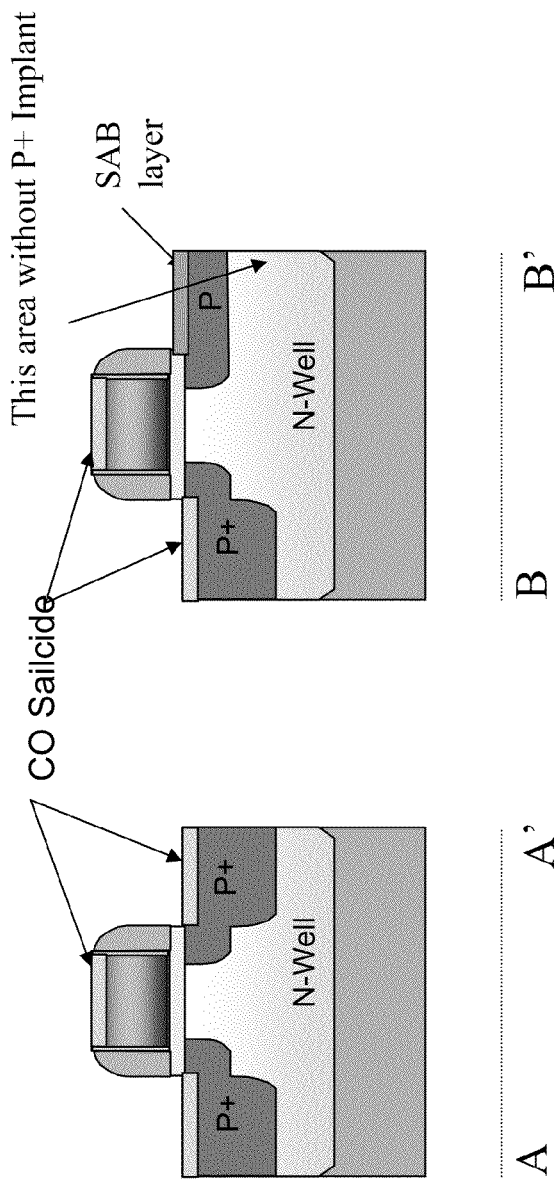

FIGS. 18A and 18B illustrate a process for performing salicide and dual drain formation. This diagram is merely an example, which should not unduly limit the scope of the claims. One of ordinary skill in the art would recognize many variations, alternatives, and modifications. In an embodiment, a salicide block layer (SAB) layer is used to mask off a portion of the drain region which is prevented from receiving the heavy drain region dopants. Of course, in a process without a salicide, for example, a separate mask can be used to define the dual drain regions. In this example, the first drain portion includes two regions on either side of the second drain portion which does not receive the heavy drain implant dopants. It is appreciated that different positions and dimensions can be used for the two drain regions.

Figure 19:
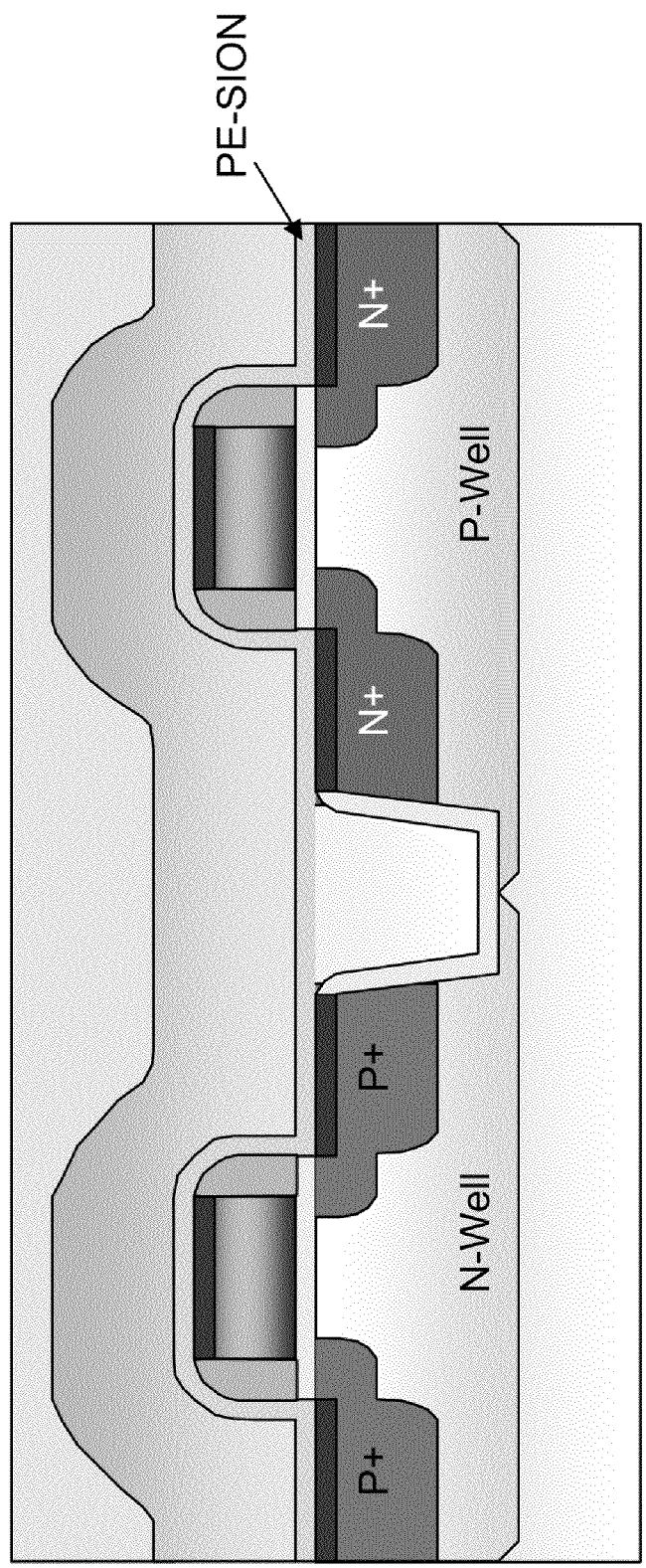
FIG. 19 is a simplified diagram illustrating a process for performing ILD layer formation.

FIG. 19 is a simplified diagram illustrating a process for performing ILD layer formation. This diagram is merely an example, which should not unduly limit the scope of the claims. One of ordinary skill in the art would recognize many variations, alternatives, and modifications.

Figure 20:
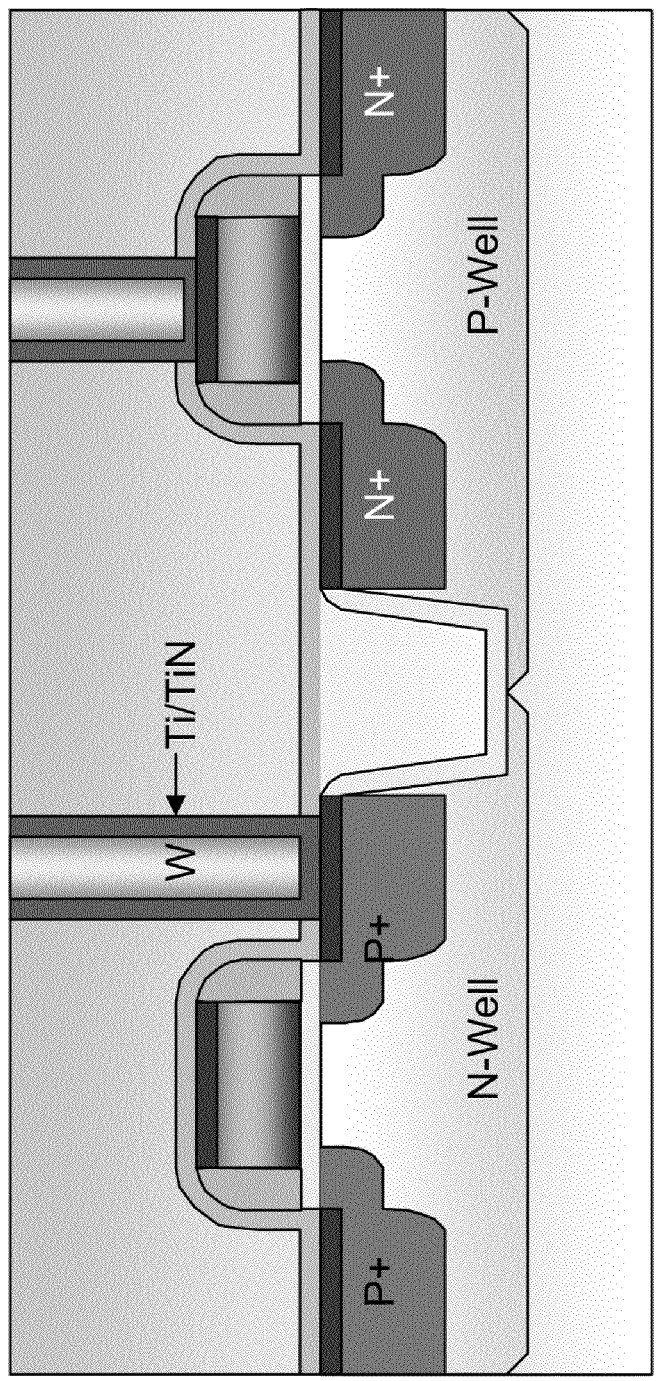
FIG. 20 is a simplified diagram illustrating a process for forming contact structures.

FIG. 20 is a simplified diagram illustrating a process for forming contact structures. This diagram is merely an example, which should not unduly limit the scope of the claims. One of ordinary skill in the art would recognize many variations, alternatives, and modifications.

Figure 21:
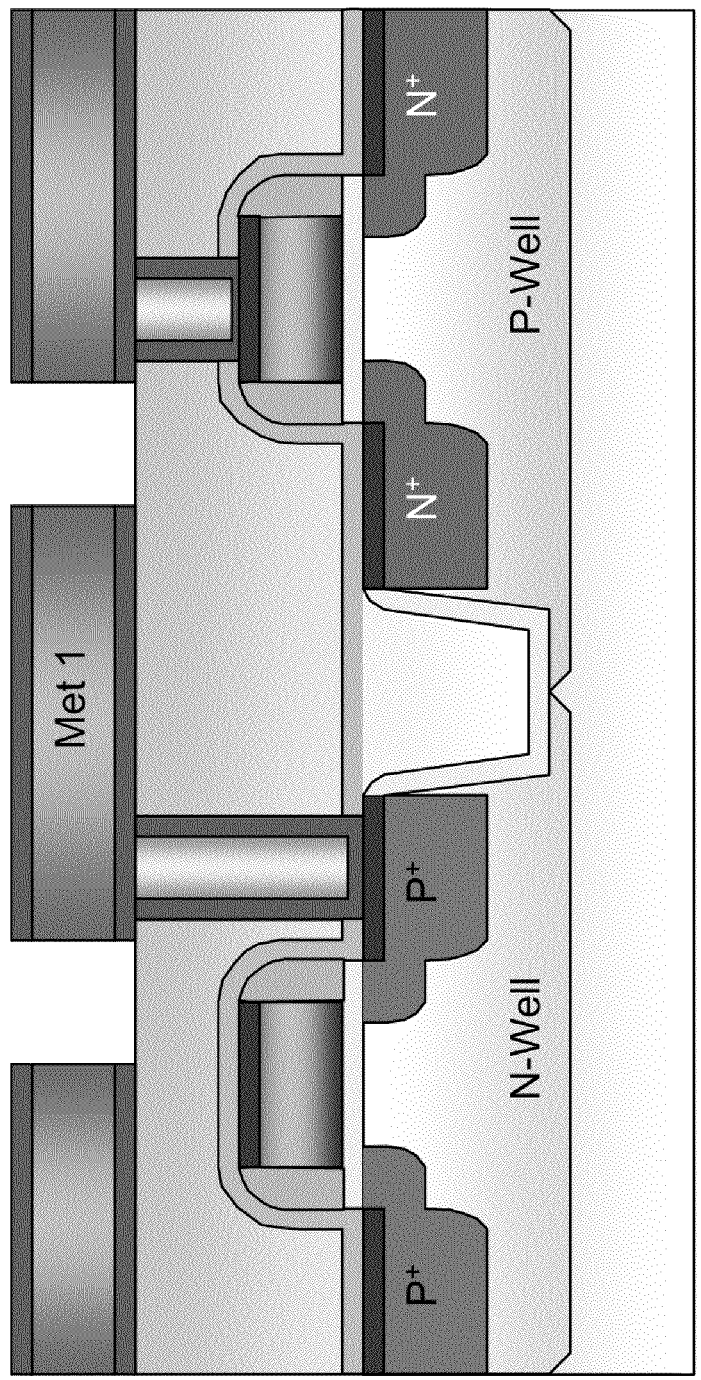
FIG. 21 is a simplified diagram illustrating a process for forming metal layer.

FIG. 21 is a simplified diagram illustrating a process for forming metal layer. This diagram is merely an example, which should not unduly limit the scope of the claims. One of ordinary skill in the art would recognize many variations, alternatives, and modifications.

Figure 22:
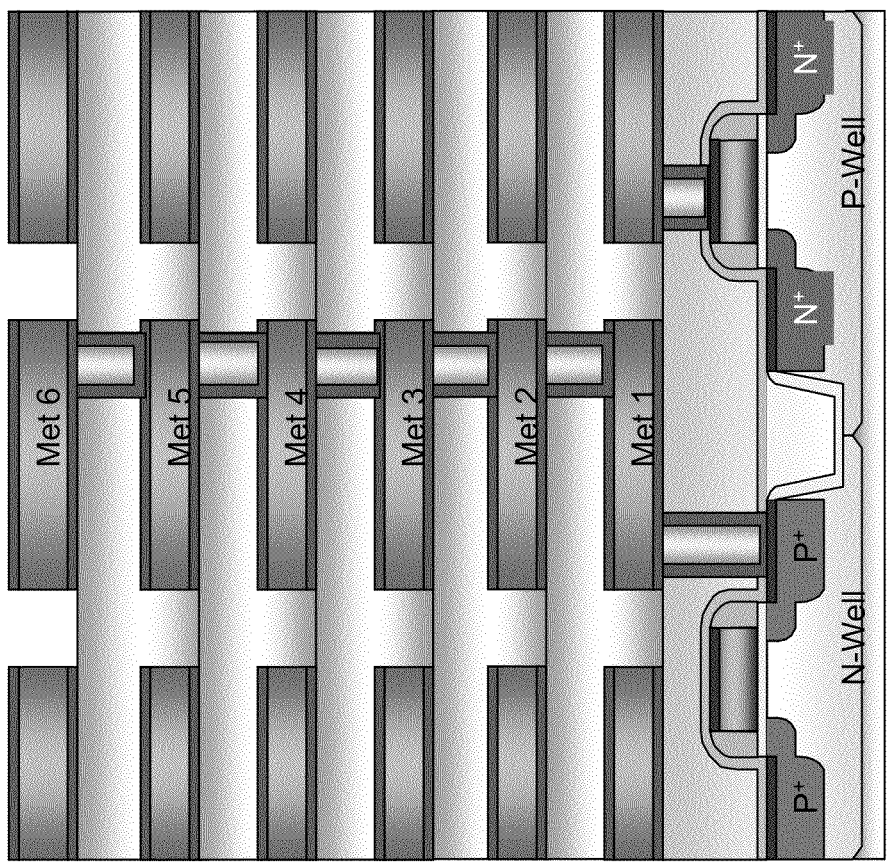
FIG. 22 is a simplified diagram illustrating a process for forming top metal layer.

FIG. 22 is a simplified diagram illustrating a process for forming top metal layers. This diagram is merely an example, which should not unduly limit the scope of the claims. One of ordinary skill in the art would recognize many variations, alternatives, and modifications.

Figure 23:
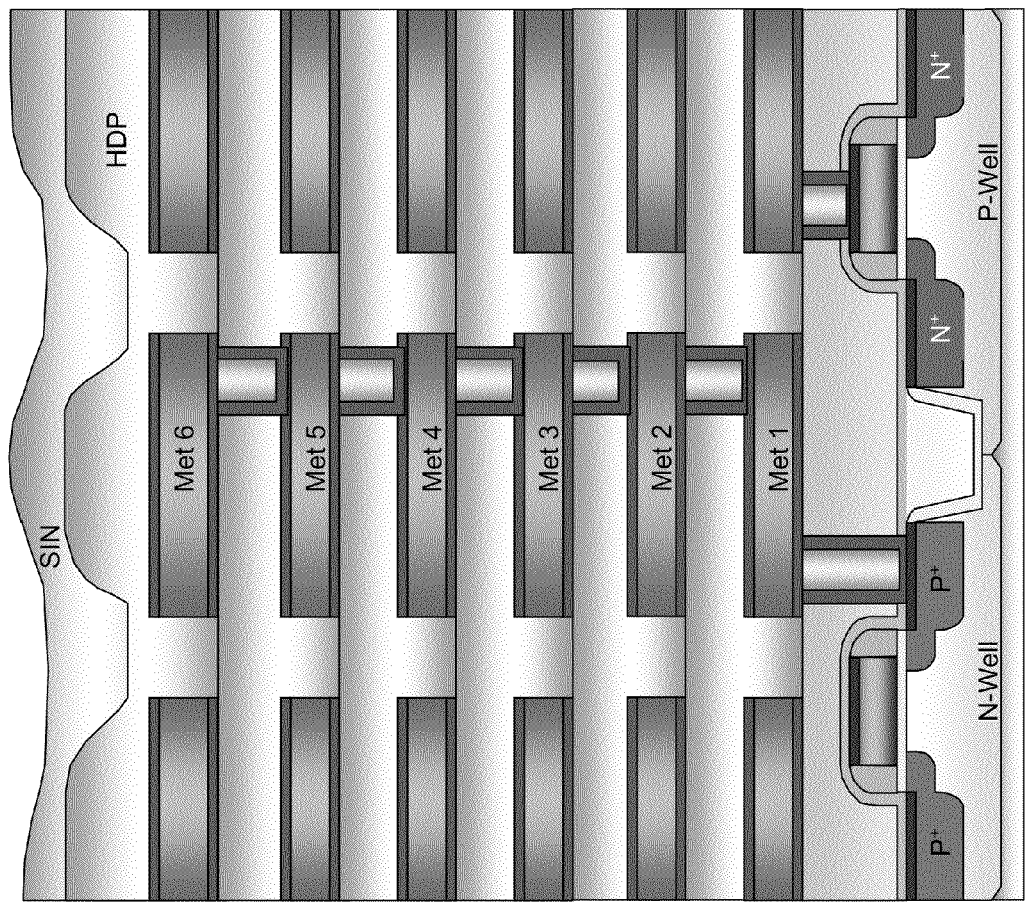
FIG. 23 is a simplified diagram illustrating a process for forming top metal layer.

FIG. 23 is a simplified diagram illustrating a process for forming a passivation layer. This diagram is merely an example, which should not unduly limit the scope of the claims. One of ordinary skill in the art would recognize many variations, alternatives, and modifications.

Figure 24:
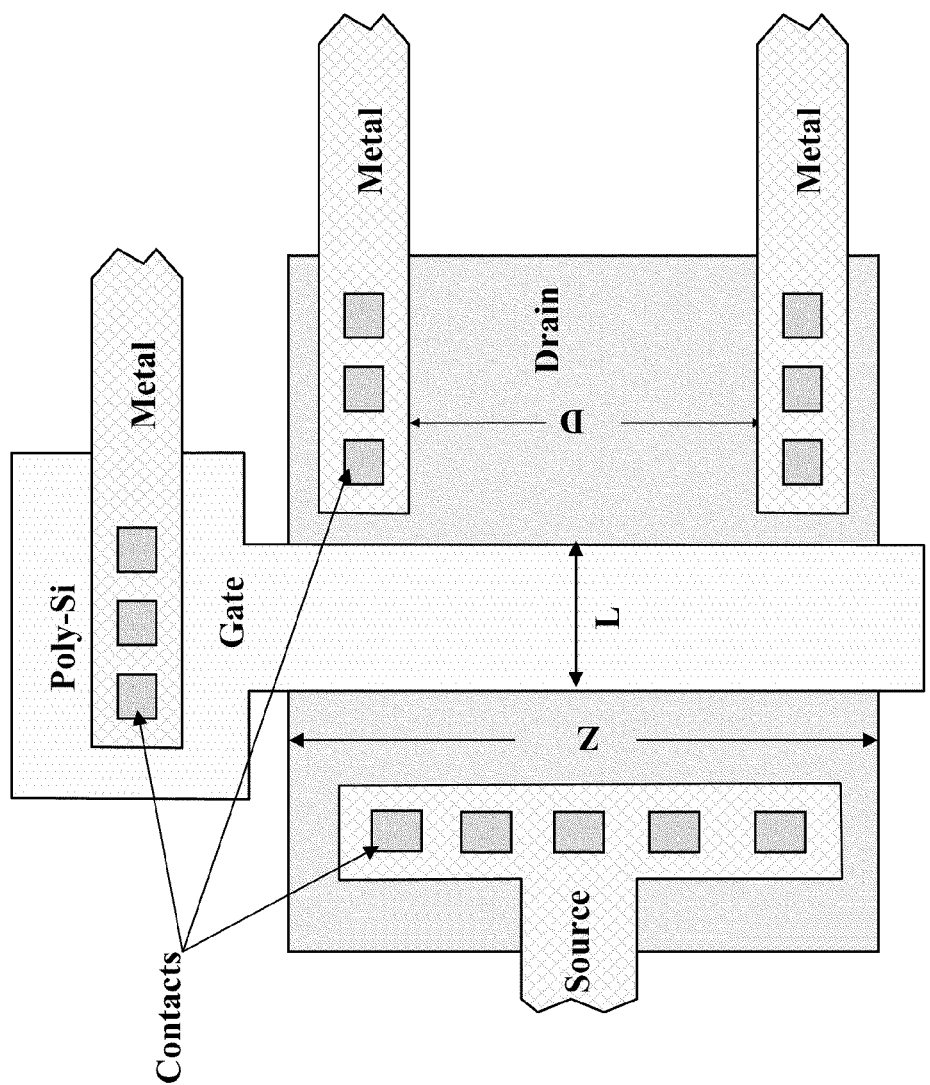
FIG. 24 FIG. 24 is a simplified diagram illustrating a top view layout diagram of a dual drain MOSFET device according to an embodiment of the present invention.

As explained above, the outline steps may be modified, repeated, omitted, and/or rearranged for specific applications and/or processes. For example, different types of material and parameters may be used for forming the device. As an example, FIG. 24 is a simplified diagram illustrating a top view layout diagram of a dual drain MOSFET device formed using the process described above. This diagram is merely an example, which should not unduly limit the scope of the claims. One of ordinary skill in the art would recognize many variations, alternatives, and modifications. In this example, the two drain regions are separated by a distance D, and the total width of the source/drain region is designated as Z. Depending on the embodiment, the relative dimensions of Z and D can be varied. For example, in some embodiments, D=50% to 98% the Z. In some embodiments, Z can range from 1 nm to 2 µm, and the channel length L can range from 1 nm to 200 nm.

The two drains can be used to apply different biases. For example, VDD1 can range from 0.01V to 3.3V, and VDD2 can range from 0.01V to +3.3V.

It is to be appreciated that according to certain embodiments, the present invention brings various benefits and advantages. For example, with two independent drains, a MOSFET is able provide dynamical control on device characteristics such as threshold voltage (Vt) and sub-threshold swing (SS). In addition, the short-channel effect can be effectively controlled and reduced.

According to a specific embodiment, the present invention simplifies the fabrication process. For example, current planar technology requires fabrication of multiple transistors, each with a different gate oxide thickness and doping to get different threshold voltages. In contrast, by implementing MOSFET with two drains, only one kind of transistor is needed.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A field effect transistor (FET), the FET comprising:
   a substrate material, the substrate material being characterized by a first conductivity type, the substrate material including a first portion, a second portion, and a third portion, the third portion being positioned between the first portion and the second portion;
   a source portion positioned within the first portion, the source portion being characterized by a second conductivity type, the second conductivity type being opposite of the first conductivity type;
   a first drain portion positioned within the second portion, the first drain portion being characterized by the second conductivity type and a first doping concentration;
   a second drain portion positioned within the second portion, the second drain portion being characterized by the second conductivity type and a second doping concentration, the second doping concentration being different from the first doping concentration;
   a first dielectric material, the first dielectric material overlaying all of the third portion, the first dielectric material partially overlaying the source portion, the first dielectric material partially overlaying the first and the second drain portions; and
   a conducting material overlaying the first dielectric material, the conducting material being configured to provide a gate contact;
   wherein the first and second drain portions share a boundary with the third portion,
   wherein the first and second drain portions are disposed side by side.
2. The FET of claim 1 wherein the first drain portion is characterized by a higher doping concentration than the second drain portion.
3. The FET of claim 1 wherein each of the source portion and the first drain portion comprises lightly-doped drain dopants and heavily doped drain dopants, and the second drain portion is free from the heavily doped drain dopants.

4. The FET of claim 3 wherein the heavily doped drain dopants are blocked from the second drain portion with a silicide blocking layer.

5. The FET of claim 1 wherein the first drain portion comprises a first region and a second region disposed on either side of the second drain portion.

6. The FET of claim 1 wherein the second drain portion is configured to receive a bias voltage to modify a current flow between the source portion and the first drain portion.

7. The FET of claim 1 wherein the second drain portion is configured to receive a bias voltage to modify a subthreshold current flow between the source portion and the first drain portion.

8. The FET of claim 1 wherein the first conductivity type is p-type.

9. The FET of claim 1 further comprising:
a first layer overlaying the source portion;
a second layer overlaying the first drain portion, the second layer including a first material;
a third layer overlaying the second drain portion, the third layer including a second material, the second material being different from the first material.

10. The FET of claim 9 wherein:
the first material is a silicide material;
the second material is a silicide blocking layer material.

11. The FET of claim 1 further comprising:
a first drain contact overlaying the first drain portion;
a second drain contact overlaying the second drain portion, the second drain contact being located away from the first drain contact at a first distance.

12. The FET of claim 11 wherein the first drain contact is electrically coupled to a first voltage supply and the second drain contact is electrically coupled to a second voltage supply.

13. A field effect transistor (FET), the FET comprising:
a substrate material, the substrate material being characterized by a first conductivity type, the substrate material including a first portion, a second portion, and a third portion, the third portion being positioned between the first portion and the second portion;
a source portion positioned within the first portion, the source portion being characterized by a second conductivity type, the second conductivity type being opposite of the first conductivity type;
a first drain portion positioned within the second portion, the first drain portion being characterized by the second conductivity type and a first doping concentration;
a second drain portion positioned within the second portion, the second drain portion being characterized by the second conductivity type and a second doping concentration, the second drain portion comprises a different material from the first drain portion;
a first dielectric material, the first dielectric material overlaying all of the third portion, the first dielectric material partially overlaying the source portion, the first dielectric material partially overlaying the first and the second drain portions; and
a conducting material overlaying the first dielectric material, the conducting material being configured to provide a gate contact;
wherein the first and second drain portions share a boundary with the third portion,
wherein the first and second drain portions are disposed side by side.

14. The FET of claim 13 wherein the first drain portion comprises a region that is doped with a p+ material, the first drain portion being covered by a cobald salicide layer.

15. The FET of claim 13 wherein the second drain portion comprises a region that is free of p+ dopants, the second drain region being covered by a salicide blocking layer.

16. The FET of claim 13 further comprising:
a first drain contact overlaying the first drain portion;
a second drain contact overlaying the second drain portion, the second drain contact being located away from the first drain contact at a distance.

17. The FET of claim 16 wherein the first drain contact is electrically coupled to a first voltage supply and the second drain contact is electrically coupled to a second voltage supply.

18. A field effect transistor (FET), the FET comprising:
a substrate material, the substrate material being characterized by a first conductivity type, the substrate material including a first portion, a second portion, and a third portion, the third portion being positioned between the first portion and the second portion;
a drain portion positioned within the first portion, the drain portion being characterized by a second conductivity type, the second conductivity type being opposite of the first conductivity type;
a first source portion positioned within the second portion, the first source portion being characterized by the second conductivity type and a first doping concentration;
a second source portion positioned within the second portion, the second source portion being different from the first source portion, the second source portion being characterized by the second conductivity type and a second doping concentration;
a first dielectric material, the first dielectric material overlaying all of the third portion, the first dielectric material partially overlaying the first and the second source portions, the first dielectric material partially overlaying the drain portion; and
a conducting material overlaying the first dielectric material, the conducting material being configured to provide a gate contact;
wherein the first and second source portions share a boundary with the third portion,
wherein the first and second source portions are disposed side by side.

19. The FET of claim 18 wherein:
the first source portion comprises p+ implants,
the second source portion is free from p+ implants,
the first conductivity type is n-type.

20. The FET of claim 18 wherein the first conductivity is p-type.

* * * * *